(12) United States Patent
Seo et al.

(10) Patent No.: US 8,436,344 B2
(45) Date of Patent: *May 7, 2013

(54) ORGANIC ELECTROLUMINESCENT DEVICE

(75) Inventors: Jeong Dae Seo, Gyeonggi-do (KR); Kyung Hoon Lee, Seoul (KR); Hee Jung Kim, Seoul (KR); Chun Gun Park, Seoul (KR); Hyoung Yun Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/714,639

(22) Filed: Mar. 1, 2010

(65) Prior Publication Data

US 2010/0155714 A1 Jun. 24, 2010

Related U.S. Application Data

(63) Continuation of application No. 10/743,778, filed on Dec. 24, 2003, now Pat. No. 7,700,201.

(30) Foreign Application Priority Data

| Dec. 24, 2002 | (KR) | 10-2002-0083279 |
| Apr. 1, 2003 | (KR) | 10-2003-0020465 |

(51) Int. Cl.
| H01L 51/54 | (2006.01) |
| C09K 11/06 | (2006.01) |
| C07C 211/57 | (2006.01) |
| C07D 413/02 | (2006.01) |
| C07D 401/02 | (2006.01) |
| C07D 215/38 | (2006.01) |
| C07F 7/10 | (2006.01) |

(52) U.S. Cl.
USPC ........... 257/40; 257/E51.026; 252/301.16; 546/264; 546/171; 564/426; 544/79; 313/504; 313/506

(58) Field of Classification Search .............. None
See application file for complete search history.

(56) References Cited

U.S. PATENT DOCUMENTS

| 5,153,073 | A | * | 10/1992 | Ohnuma et al. ............ 428/461 |
| 5,935,721 | A |   | 8/1999 | Shi et al. |
| 6,534,199 | B1 |   | 3/2003 | Hosokawa et al. |
| 7,429,425 | B2 |   | 9/2008 | Ikeda et al. |
| 7,700,201 | B2 | * | 4/2010 | Seo et al. ............. 428/690 |
| 2004/0053069 | A1 |   | 3/2004 | Sotoyama et al. |
| 2005/0064233 | A1 | * | 3/2005 | Matsuura et al. ............ 428/690 |
| 2005/0123787 | A1 |   | 6/2005 | Robello et al. |

FOREIGN PATENT DOCUMENTS

| EP | 1 347 671 A1 | 9/2003 |
| EP | 1 404 160 A1 | 3/2004 |
| JP | 56-120649 A | 9/1981 |
| JP | 3-162485 A | 7/1991 |
| JP | 4-175395 A | 6/1992 |
| JP | 7-157754 A | 6/1995 |
| JP | 8-199162 A | 8/1996 |
| JP | 10-88122 A | 4/1998 |
| JP | 2002-63988 A | 2/2002 |
| JP | 2004-221045 A | 8/2004 |
| WO | 02/38524 A1 | 5/2002 |
| WO | WO 02/052904 A1 | 7/2002 |
| WO | WO 02/102118 A1 | 12/2002 |
| WO | 2004/018587 A1 | 3/2004 |
| WO | 2004/018588 A1 | 3/2004 |

OTHER PUBLICATIONS

European Search Report (Jul. 4, 2005).
Database WPI; Section Ch, Week 199533; Derwent Publications Ltd.; London GB; AN 1995-252500 XP002334356.
Japanese Office Action dated Feb. 28, 2006.

* cited by examiner

*Primary Examiner* — Jennifer Chriss
*Assistant Examiner* — Camie Thompson
(74) *Attorney, Agent, or Firm* — Morgan, Lewis & Bockius LLP

(57) ABSTRACT

Disclosed is an organic electroluminescent device including a substrate, a first and a second electrode, and an emitting layer formed between the first electrode and the second electrode. The emitting layer includes a plurality of materials which is a blue emitting material using a following chemical formula as dopant.

[Chemical formula]

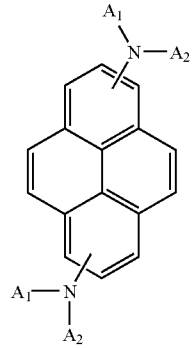

In this case, at least one of $A_1$ and $A_2$ is selected from a substituted or non-substituted aromatic group, a heterocyclic group, an aliphatic group, and hydrogen.

4 Claims, No Drawings

ORGANIC ELECTROLUMINESCENT DEVICE

CROSS-REFERENCE TO RELATED APPLICATIONS

This application is a Continuation of application Ser. No. 10/743,778, filed Dec. 24, 2003. This invention claims the benefit of Korean Patent Application No. 10-2002-0083279 filed in Korea on Dec. 24, 2002 and Korean Patent Application No. 10-2003-0020465 filed in Korea on Apr. 1, 2003, which are hereby incorporated by reference in their entity.

BACKGROUND OF THE INVENTION

1. Field of the Invention

The present invention relates to an organic luminescent device, and more particularly, to a blue emitting material of an emitting layer.

2. Description of the Related Art

Recently, with the trend of a large sized display, a request of a flat display that occupies a small area has been increased. One example of the flat display is an organic electroluminescent device also called as an organic light emitting diode (OLED). And, technology for the organic electroluminescent display is developed rapidly, whereby various prototypes have been in market already.

The organic electroluminescent device emits light in a manner that electric charges are injected in an organic layer formed between an anode and a cathode so as to form a pair of electron and hole to generate an exciton and an excited state of the exciton falls to a ground state so as to emit light.

The organic electroluminescent device is not only formed on a flexible transparent substrate such as a plastic but also operated at a lower voltage (less than 10V) compared to a plasma display panel or an inorganic electroluminescent display.

Also, the organic electroluminescent device has advantages in that power consumption is reduced and various colors are available.

Moreover, the organic electroluminescent device enables to express three colors including green, blue, and red. Therefore, many concerns are focused on the organic electroluminescent device as the next generation full color display.

The organic electroluminescent device may be realized to emit blue, green, or red light in accordance with a material forming the emitting layer.

Particularly, the emitting layer for blue luminescence is a host employing materials such as PBD and DPVBi and is fabricated by doping 1-3% of materials such as perylene, coumarine, and pyrene as a dopant.

However, it is a biggest problem in realizing blue luminescence of the organic electroluminescent device that a degree of color purity and the luminescence efficiency are lowered.

The conventional blue emitting materials emit light with a long wavelength during emission and had a problem of lowering the degree of color purity and the luminescence efficiency, and even more lowered at high doping density.

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic luminescent device includes a substrate; a first and second electrodes formed on the substrate; an emitting layer formed between the first electrode and the second electrode, the emitting layer having a plurality of materials and being a blue emitting material using a chemical formula 1 as a dopant.

[Chemical formula 1]

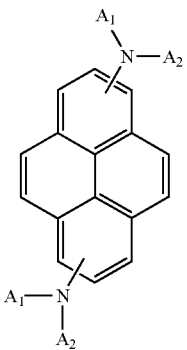

In this case, at least one of $A_1$ and $A_2$ is selected from a substituted or non-substituted aromatic group, a heterocyclic group, an aliphatic group, and hydrogen.

Wt. % of the material in the chemical formula 1 is 0.1-49.9 wt. % of a total weight of the emitting layer.

Material forming the emitting layer together with the material of the chemical formula 1 is formed as a structure of a following chemical formula 2.

B1-X-B2                            [Chemical formula 2]

Wherein, the X is selected from a group consisting of naphthalene, anthracene, phenanthrene, pyrene, perylene, and quinoline and at least one of the B1 and B2 is selected from a group consisting of aryl, alkylaryl, alkoxyaryl, arylaminoaryl and alkylaminoaryl.

At least one of the B1, B2 is selected from phenyl, biphenyl, pyridyl, naphthyl, tritylphenyl, biphenylenyl, anthryl, phenanthryl, pyrenyl, perylenyl, quinolyl, isoquinolyl, fluorenyl, terphenyl, tolyl, xylyl, methylnaphthyl, and hydrogen.

At least one of the A1 and A2 is selected from a substituted or non-substituted phenyl, a substituted or non-substituted biphenyl, a substituted or non-substituted pyridyl, a substituted or non-substituted naphthyl, a substituted or non-substituted quinolyl, a substituted or non-substituted isoquinolyl, a substituted or non-substituted fluorenyl, a substituted or non-substituted terphenyl, methyl, ethyl, propyl, i-propyl, and t-buthyl.

The substituent of each substituted A1 and A2 is at least one and selected from methyl, ethyl, propyl, i-propyl, t-butyl, cyclohexyl, methoxy, ethoxy, propoxy, butoxy, dimethylamino, trimethylsilyl, fluorine, chroline, phenoxy, tolyloxy, dimethylamino, diethylamino, diphenylamino, and triphenylsilyl.

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the present invention, the emitting layer formed between a first electrode and a second electrode includes a plurality of materials and a blue material using a following chemical formula as a dopant.

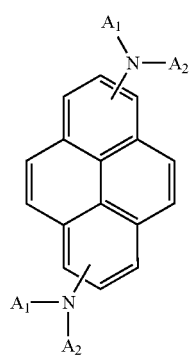

[Chemical formula 1]

In this case, at least one of $A_1$ and $A_2$ is selected from a substituted or non-substituted aromatic group, a heterocyclic group, an aliphatic group, or hydrogen.

A wt. % of the material in the chemical formula 1 is 0.1~49.9 wt % among a total weight of the emitting layer. The material forming the emitting layer with the chemical formula 1 is formed as a structure of a following chemical formula 2.

B1-X—B2  [Chemical formula 2]

In this case, X is selected from a group consisting of naphthalene, anthracene, phenanthrene, pyrene, perylene, and quinoline. At least one of the B1 and B2 may be selected from a group consisting of aryl, alkylaryl, alkoxyaryl, arylaminoaryl and alkylaminoaryl.

Also, at least one of the B1 and B2 may be selected from a group consisting of phenyl, biphenyl, pyridyl, naphthyl, tritylphenyl, biphenylenyl, anthryl, phenanthryl, pyrenyl, perylenyl, quinolyl, isoquinolyl, fluorenyl, terphenyl, tolyl, xylyl, methylnaphthyl, and hydrogen.

In this case, the material forming the emitting layer together with the chemical formula 1 is one of following chemical formulas.

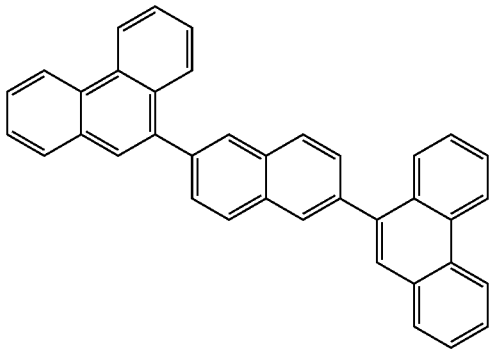

H-1

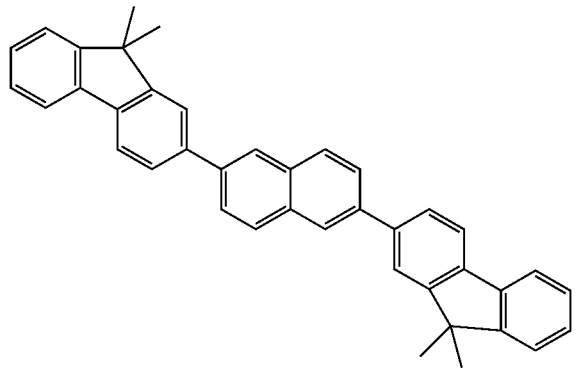

H-2

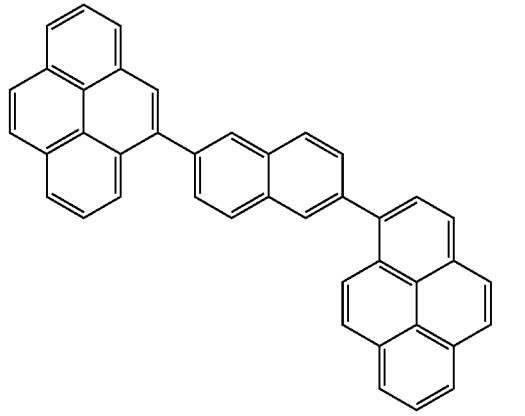

H-3

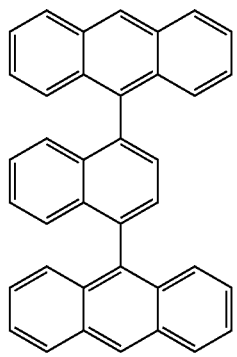

H-4

H-5
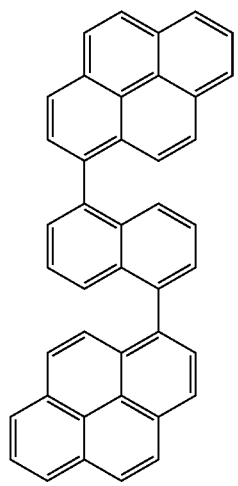
H-6
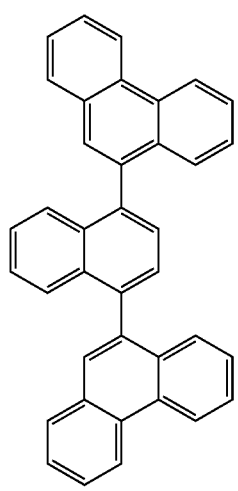
H-7
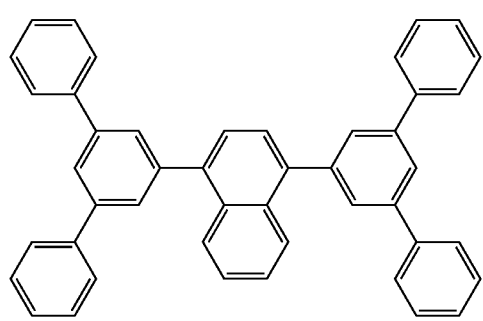
H-8
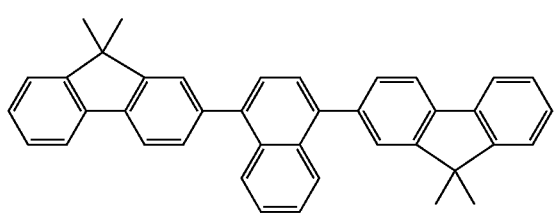
H-9
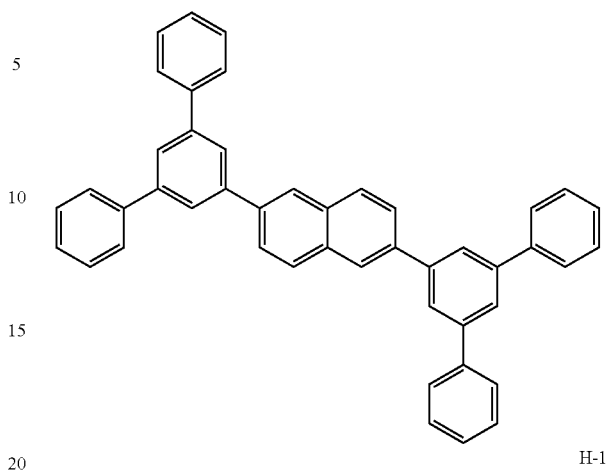
H-10
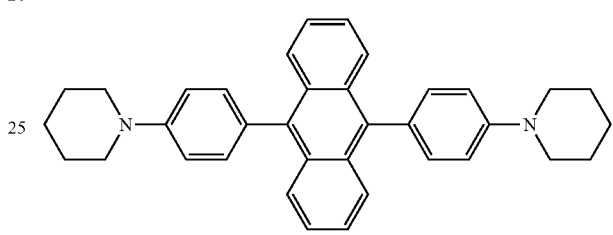
H-11
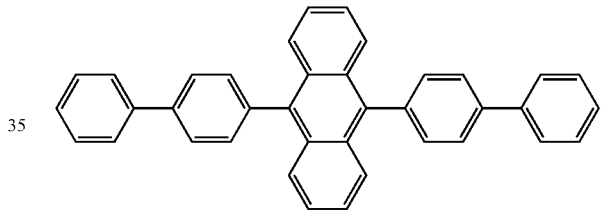
H-12
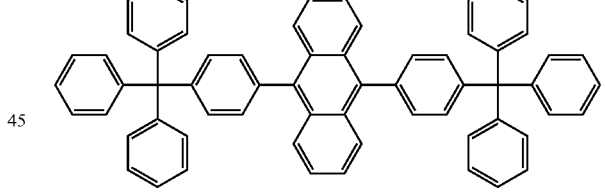
H-13
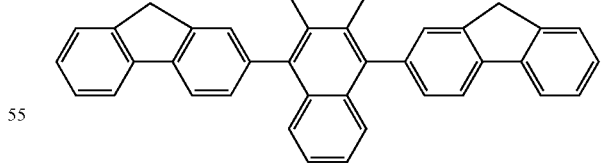
H-14
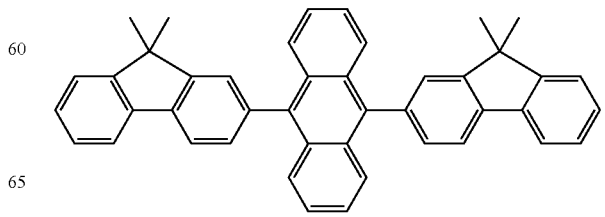

H-15
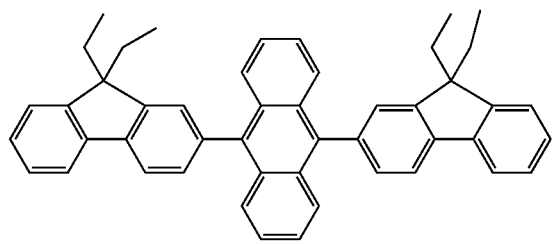
H-16
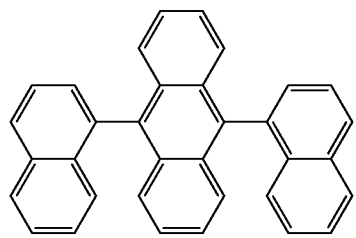
H-17
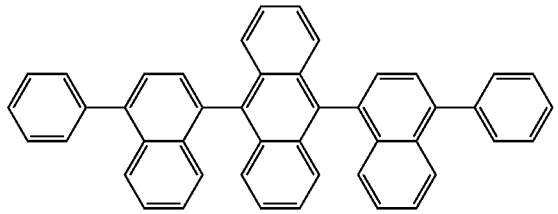
H-18
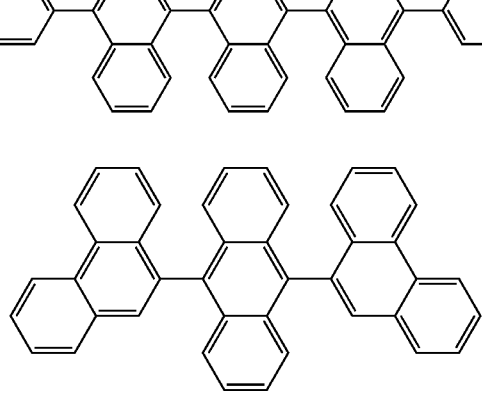
H-19
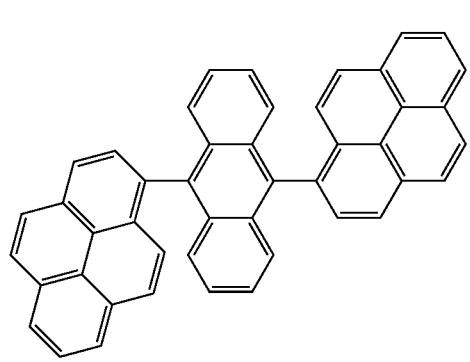
H-20
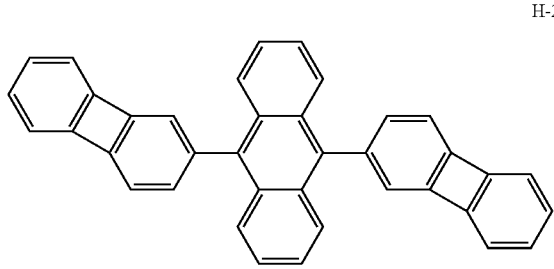
H-21
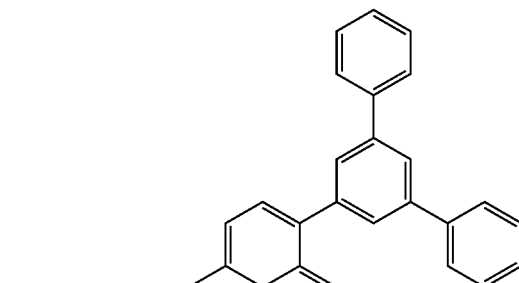
H-22
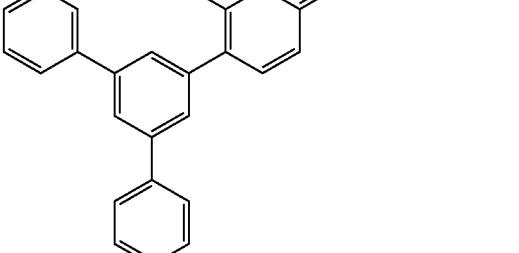
H-23
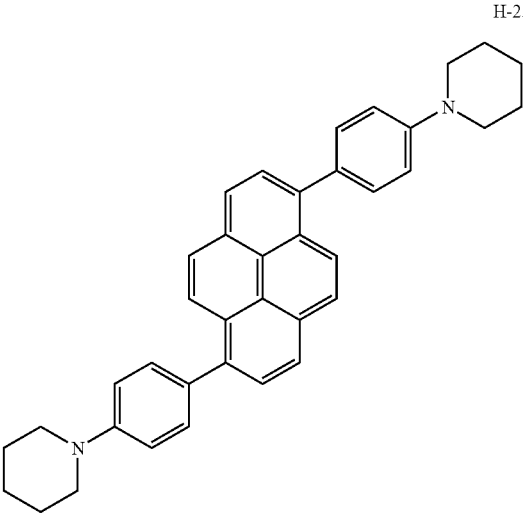

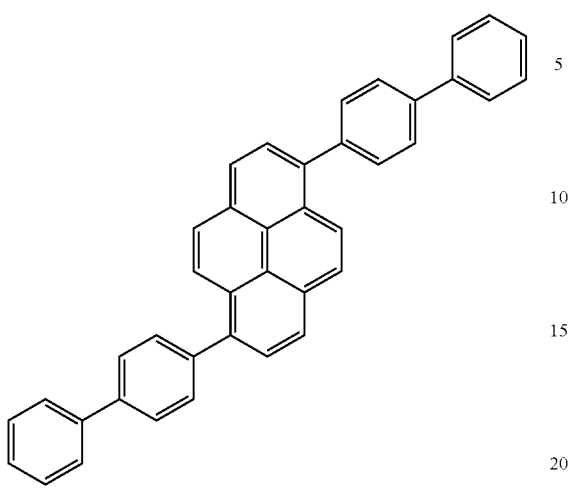

H-24

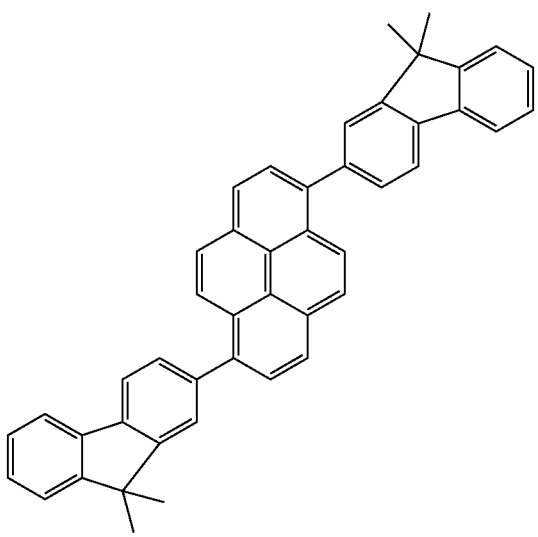

H-27

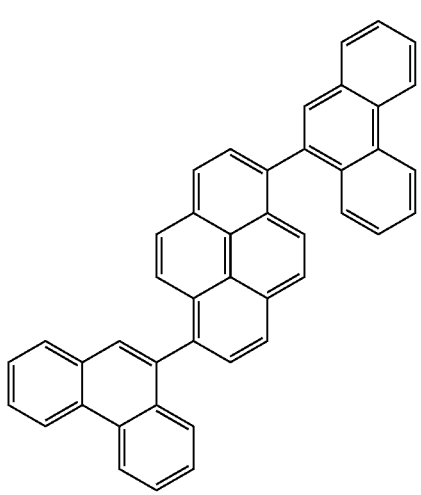

H-25

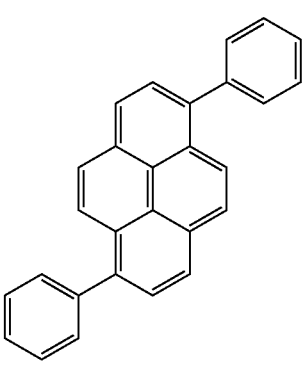

H-28
H-29

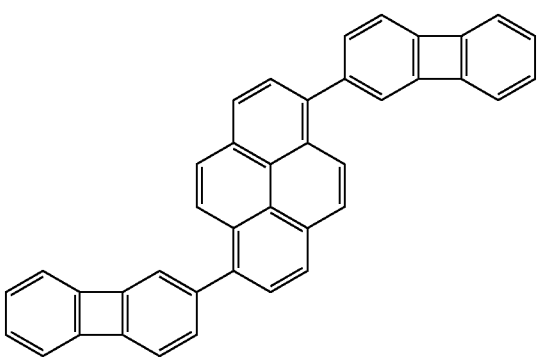

H-30

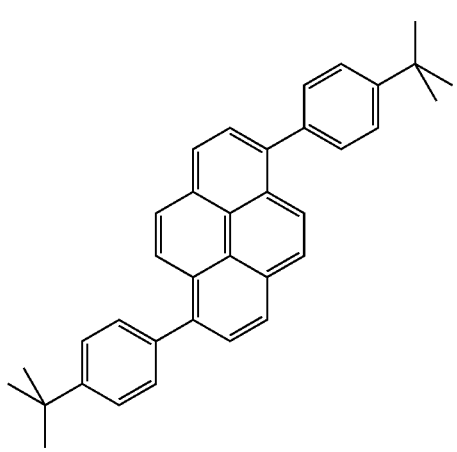

H-26

Also, in a case of the chemical formula 1, at least one of the A1 and A2 may be selected from a substituted or non-substituted aromatic group, a heterocyclic group, an aliphatic group, and hydrogen.

Particularly, at least one of A1 and A2 may be selected from a substituted or non-substituted phenyl, a substituted or non-substituted biphenyl, a substituted or non-substituted pyridyl, a substituted or non-substituted naphthyl, a substituted or non-substituted quinolyl, a substituted or non-substituted isoquinolyl, a substituted or non-substituted fluorenyl, a substituted or non-substituted terphenyl, methyl, ethyl, propyl, i-propyl, and t-buthyl.

In this case, each substituent of the substituted A1 and A2 is at least one and selected from alkyl, alkoxy, alkylamino, alkylsilyl, halogen, aryl, aryloxy, arylamino, arylsilyl, and hydrogen.

For example, the substituent of the A1 and A2 may be selected from methyl, ethyl, propyl, i-propyl, t-butyl, cyclohexyl, methoxy, ethoxy, propoxy, butoxy, dimethylamino, trimethylsilyl, fluorine, chlorine, phenoxy, tolyloxy, dimethylamino, diethylamino, diphenylamino, and triphenylsilyl.

Particularly, at least one of the substituted or non-substituted A1 and A2 may be one of the following chemical formulas.

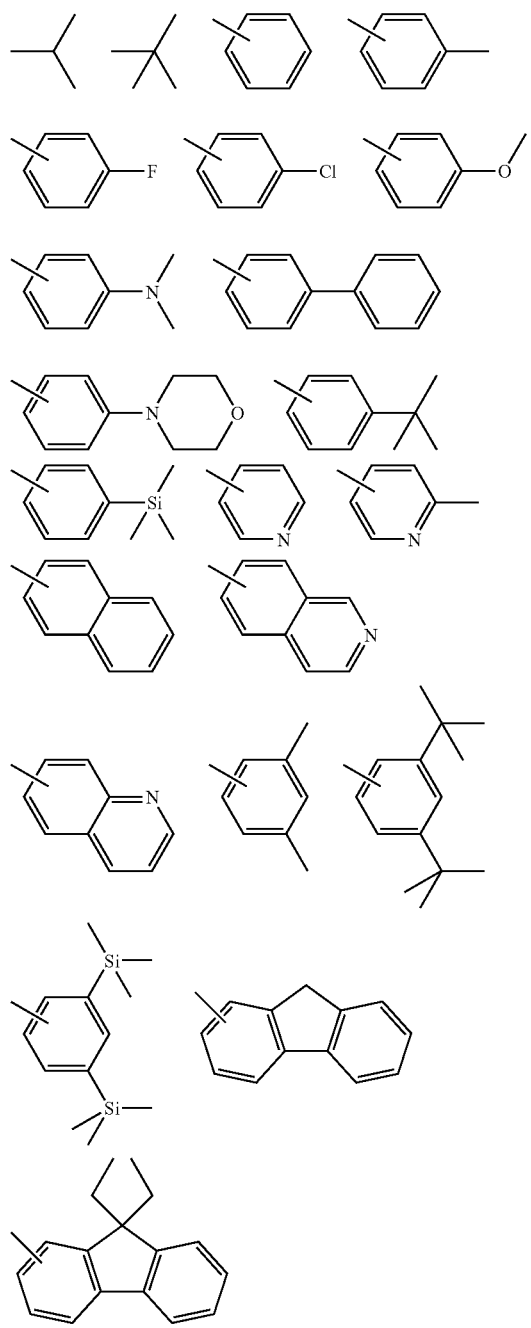

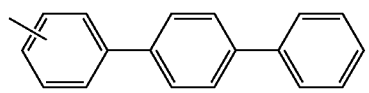

The blue emitting material having the substituent of the present invention may be one of the following chemical formulas.

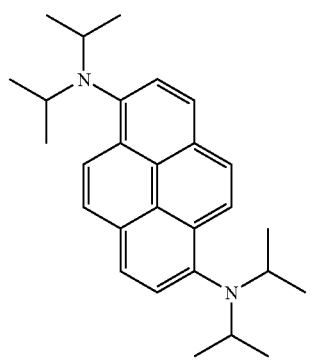

S-1

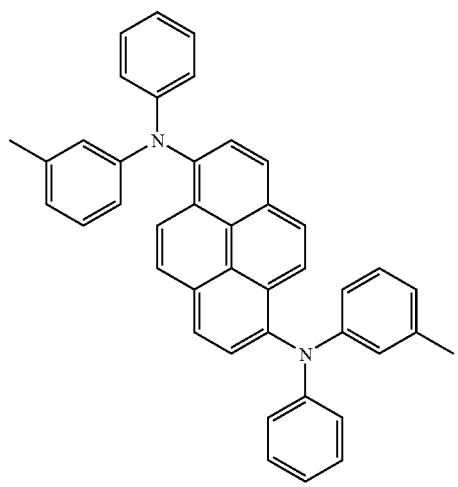

S-2

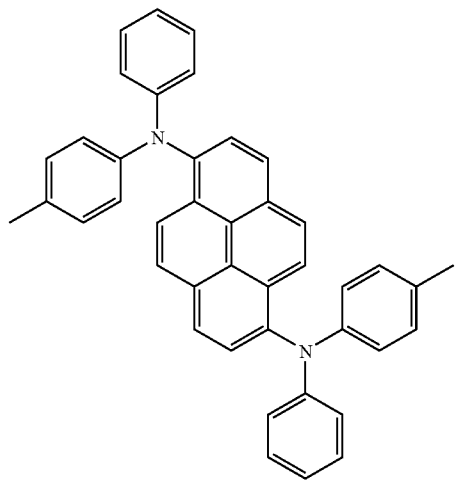

S-3

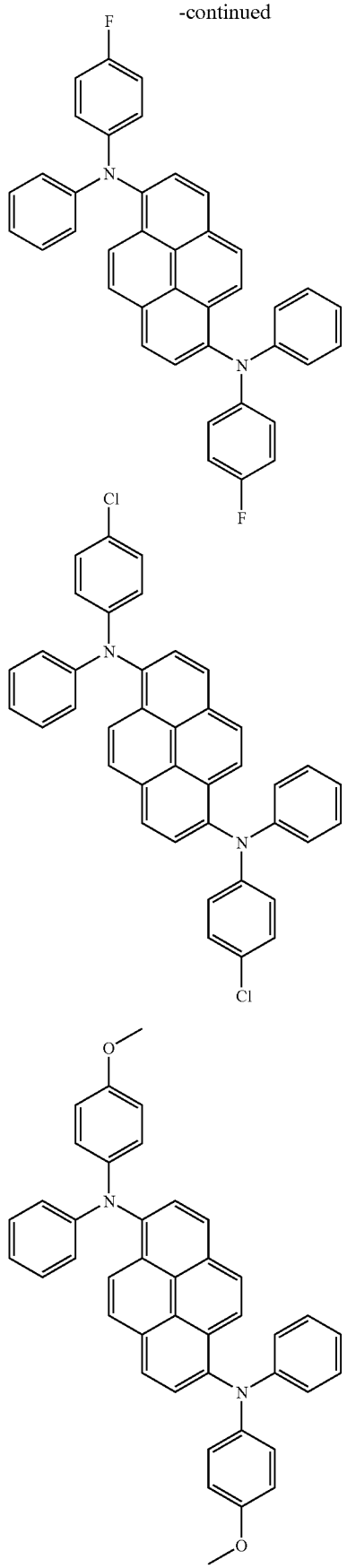
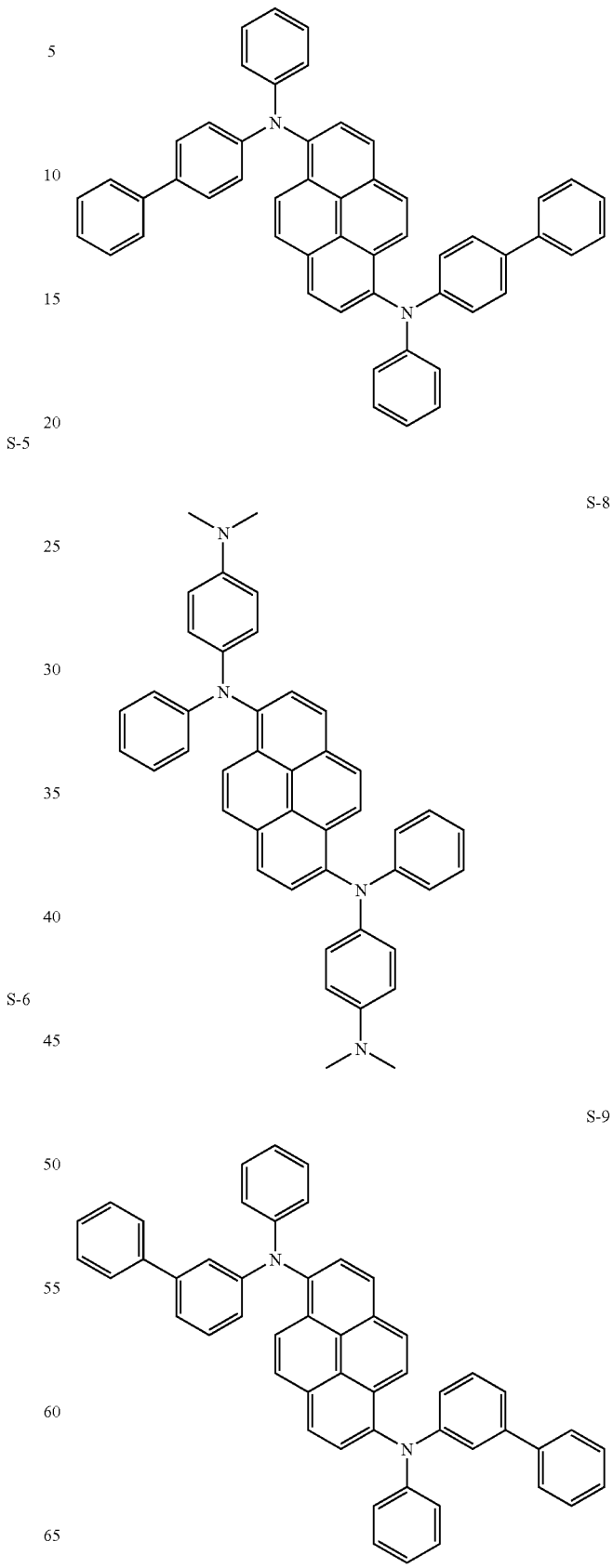

S-10
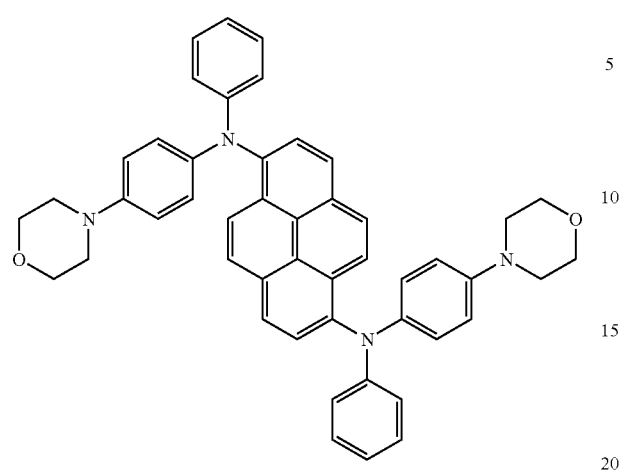
S-13
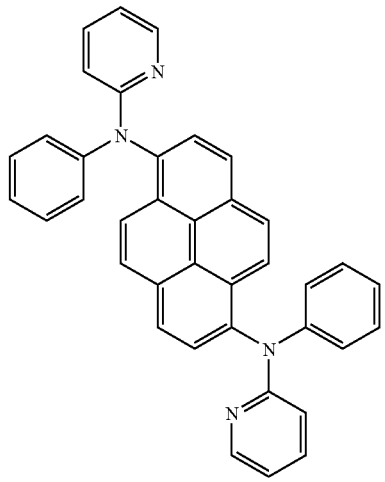
S-11
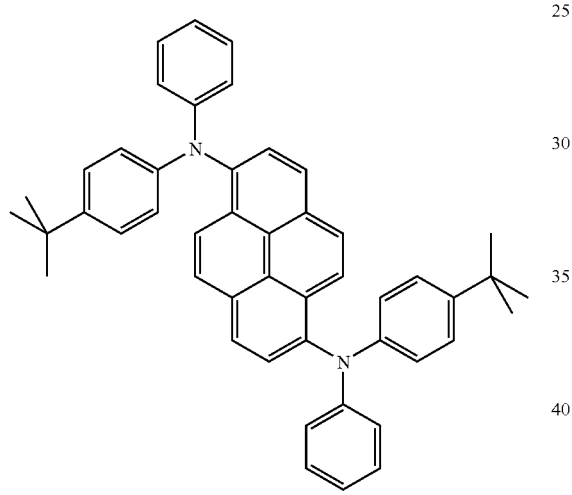
S-14
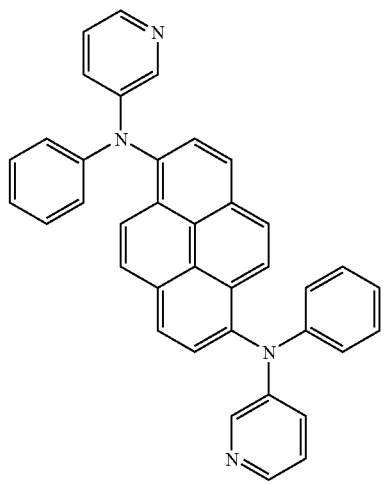
S-12
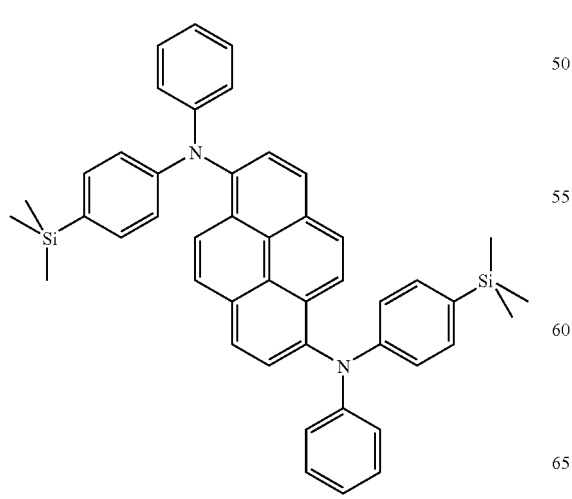
S-15
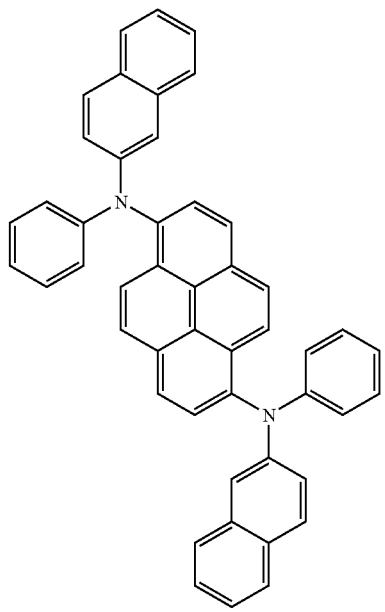

S-16
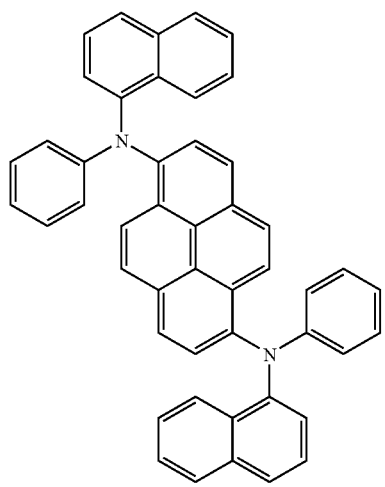
S-19
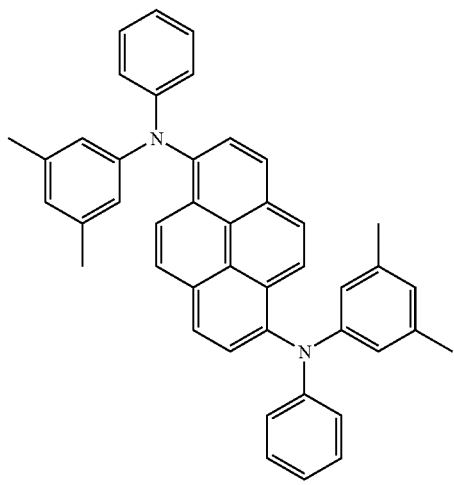
S-17
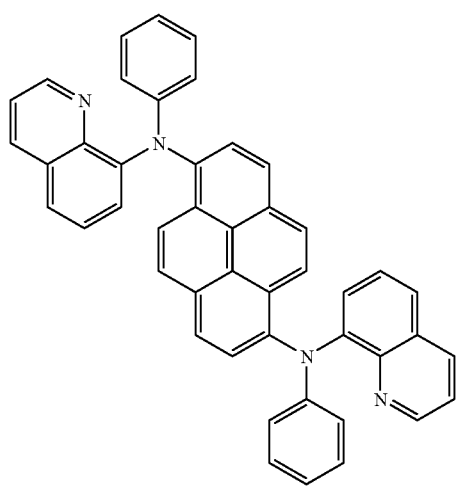
S-20
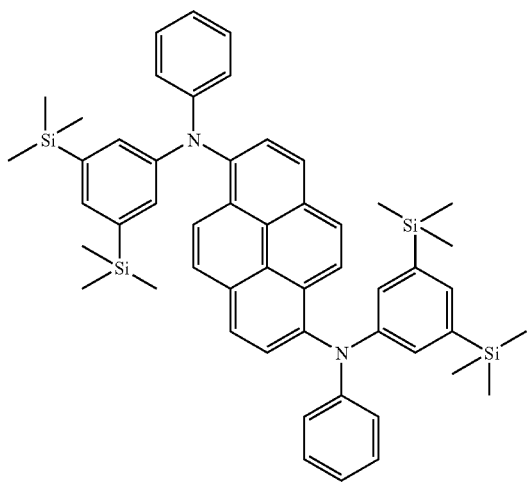
S-18
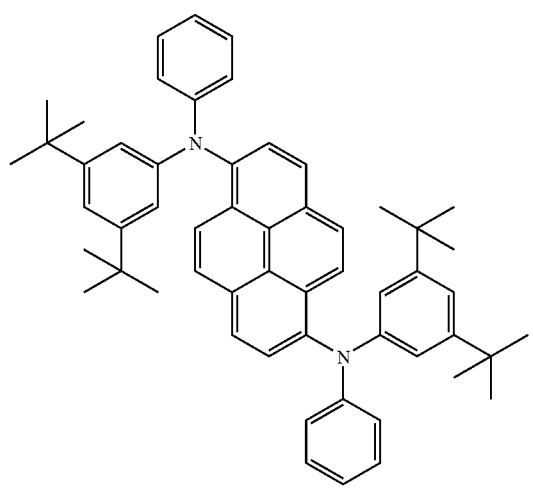
S-21
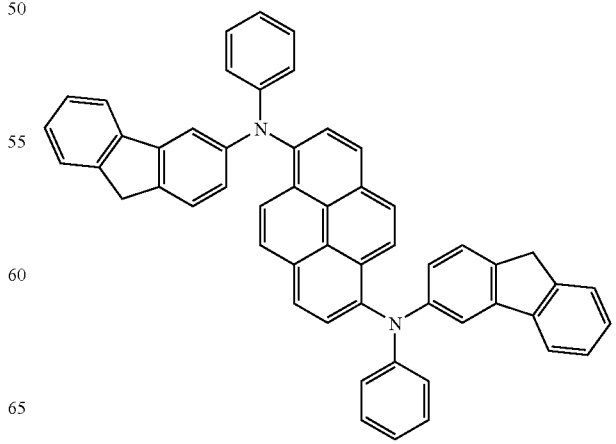

S-22
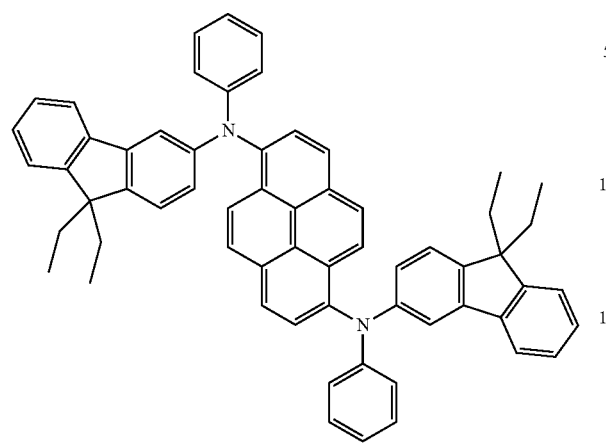
S-25
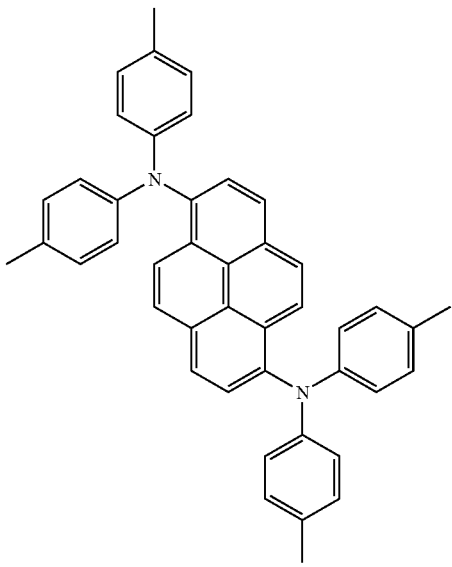
S-23
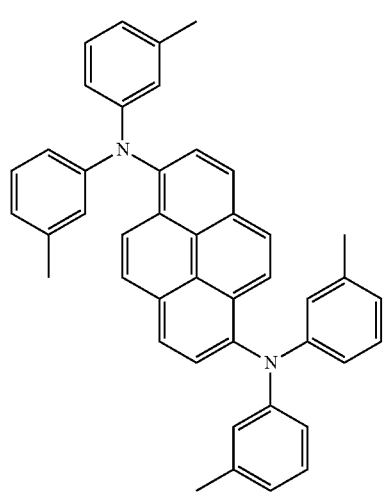
S-26
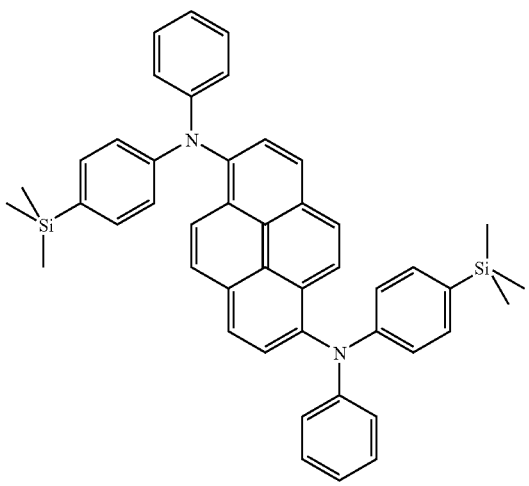
S-24
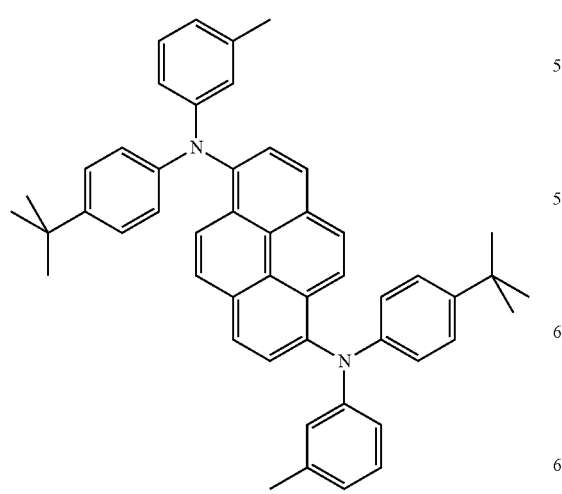
S-27
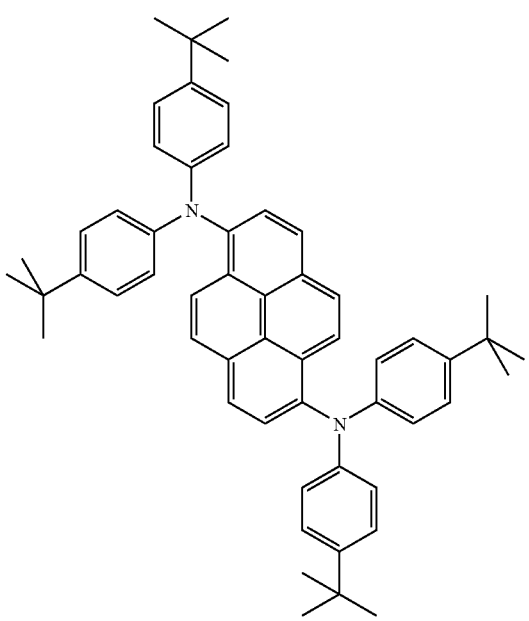

S-28
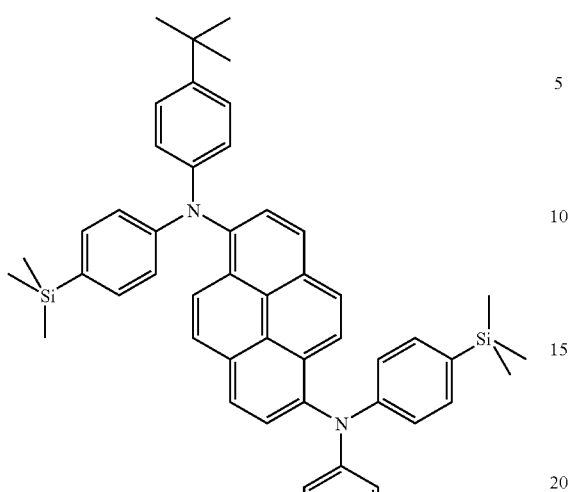
S-29
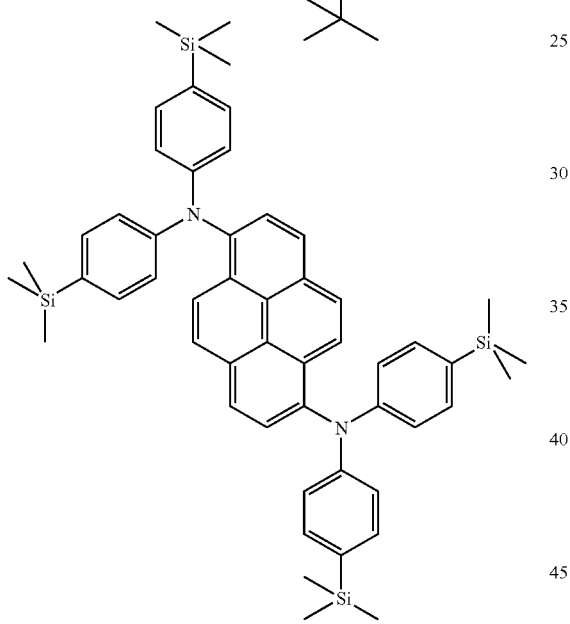
S-30
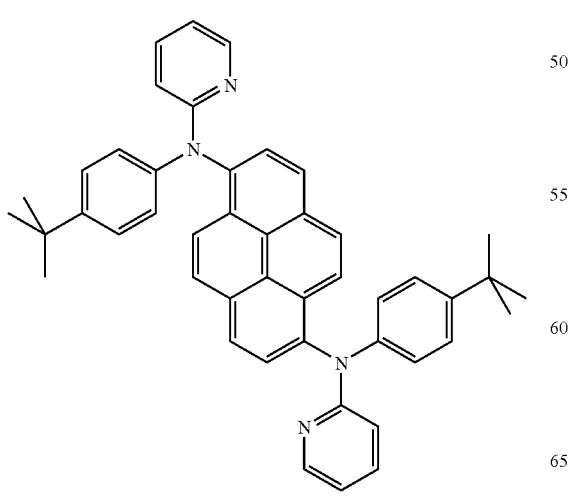
S-31
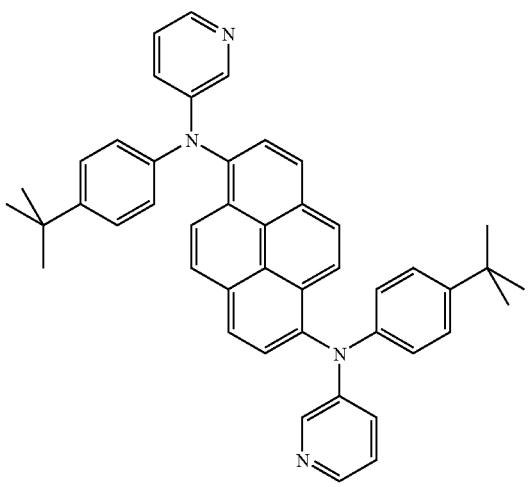
S-32
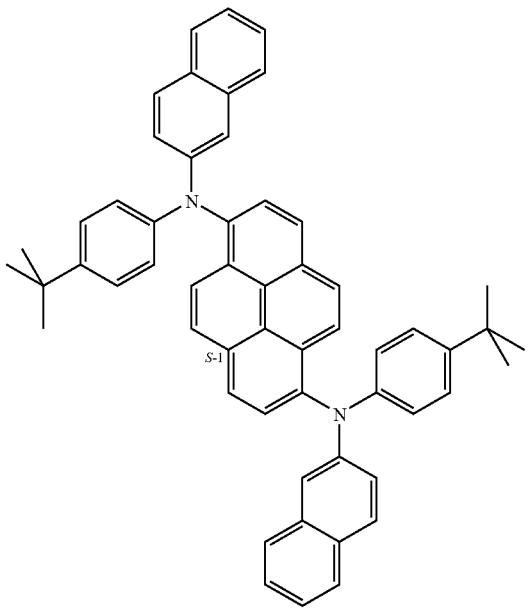
S-33
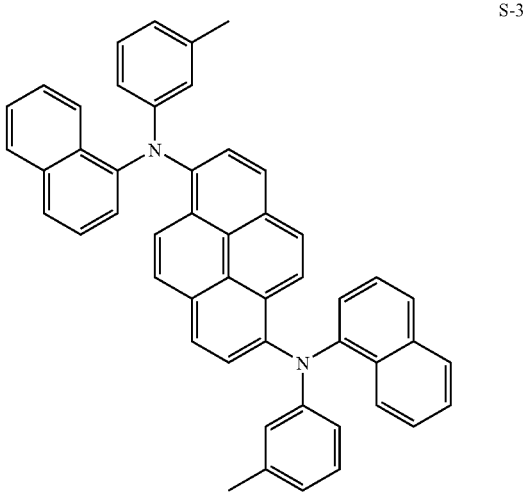

S-34
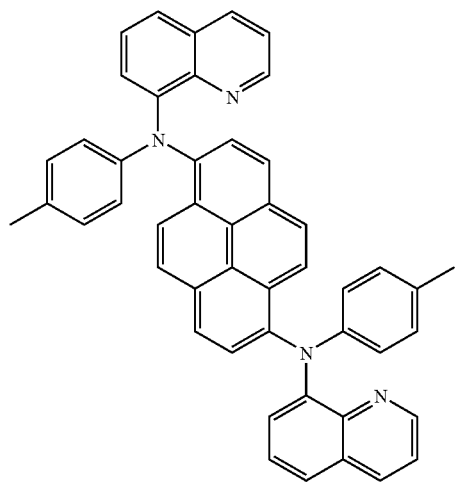
S-37
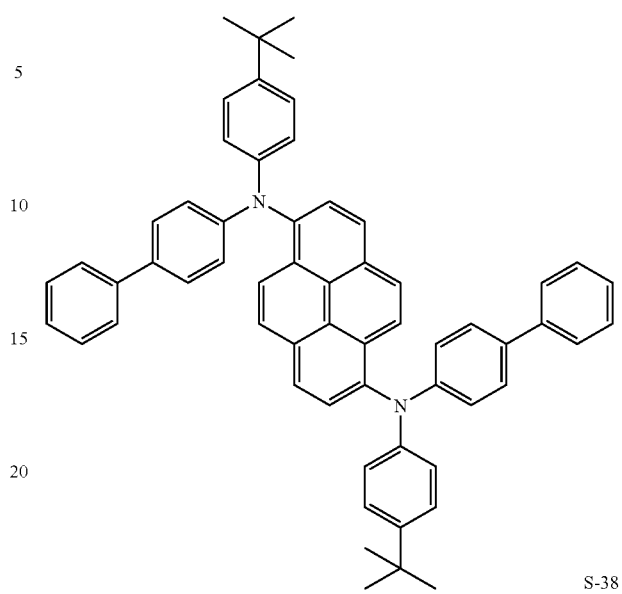
S-35
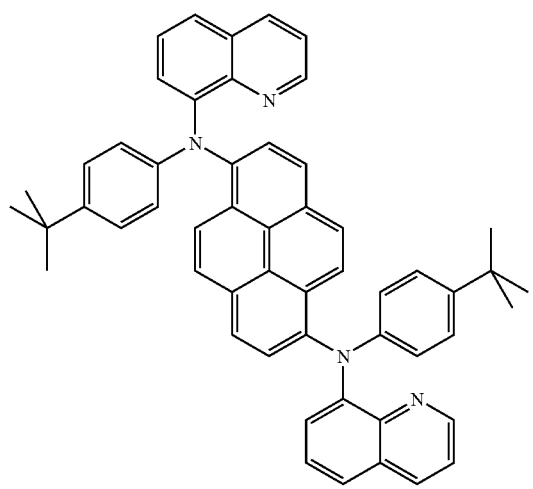
S-38
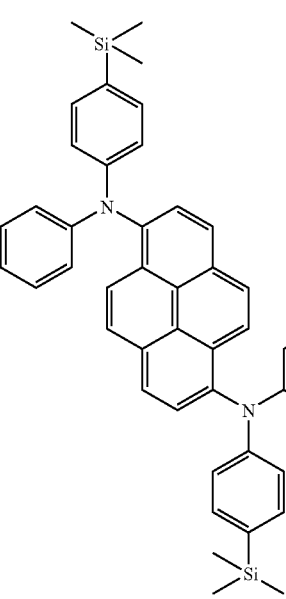
S-36
S-39
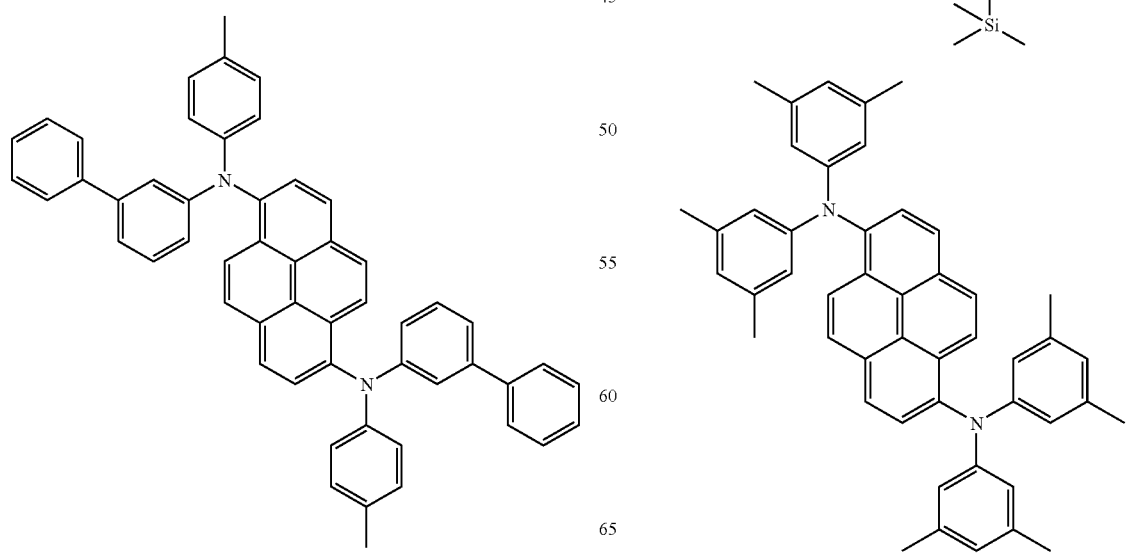

S-40 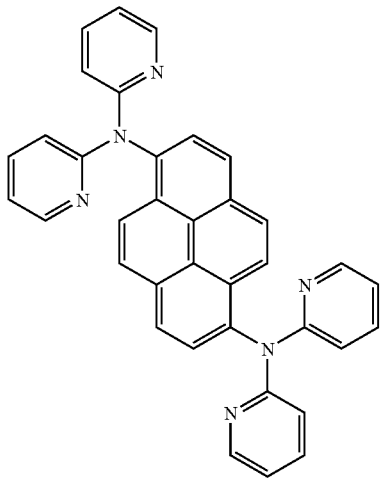
S-43 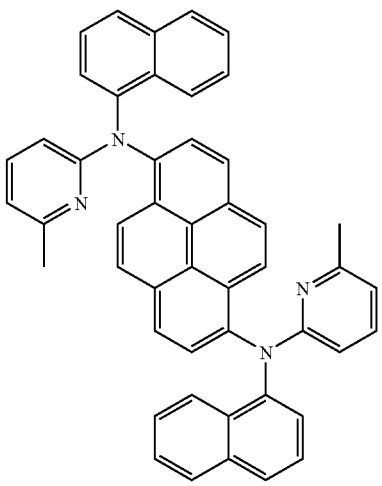
S-41 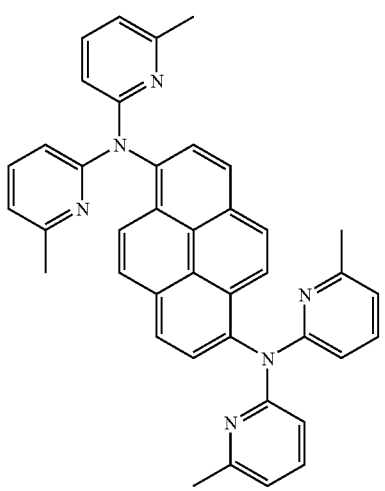
S-44 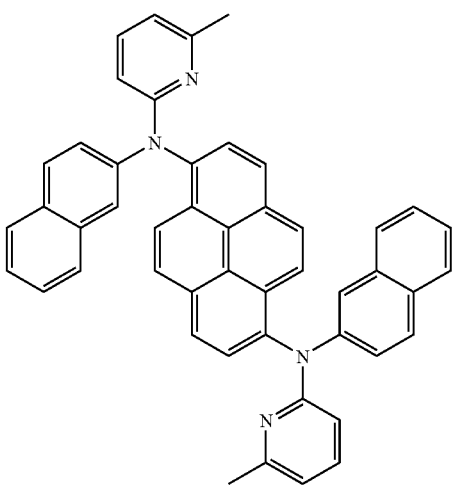
S-42 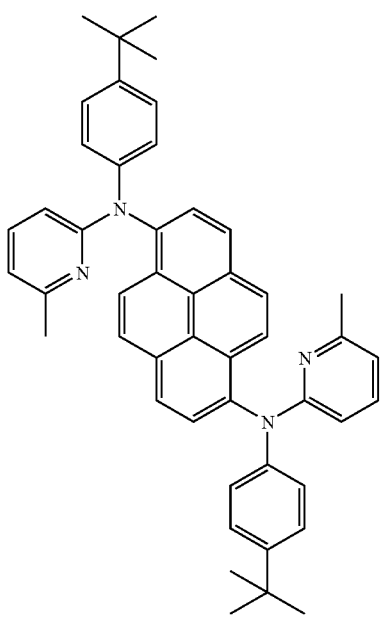
S-45 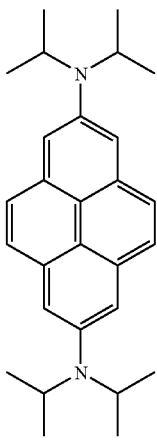

S-46
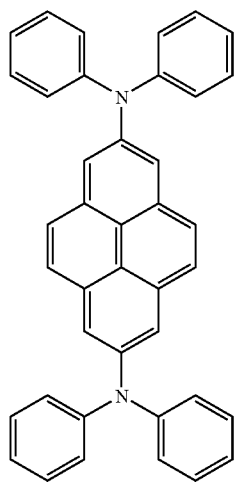
S-47
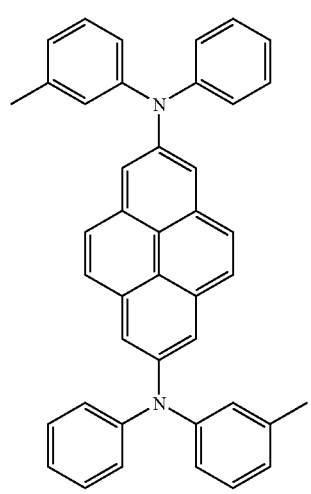
S-48
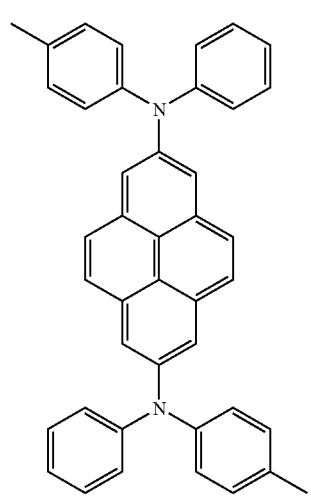
S-49
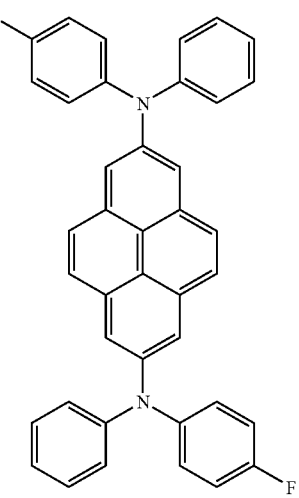
S-50
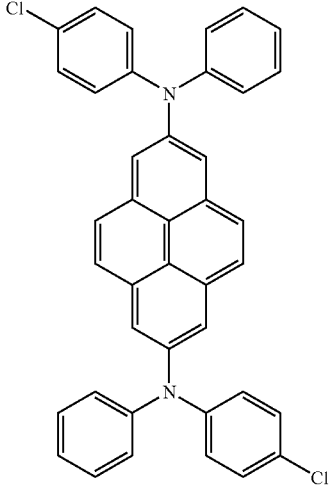
S-51
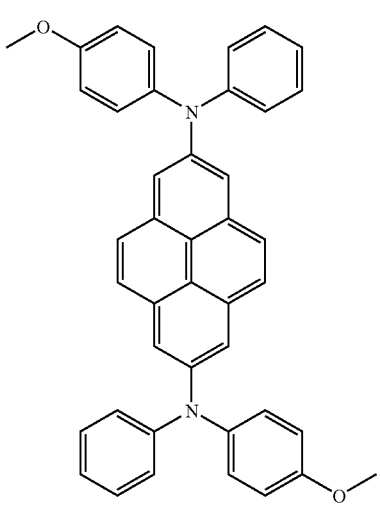

S-52
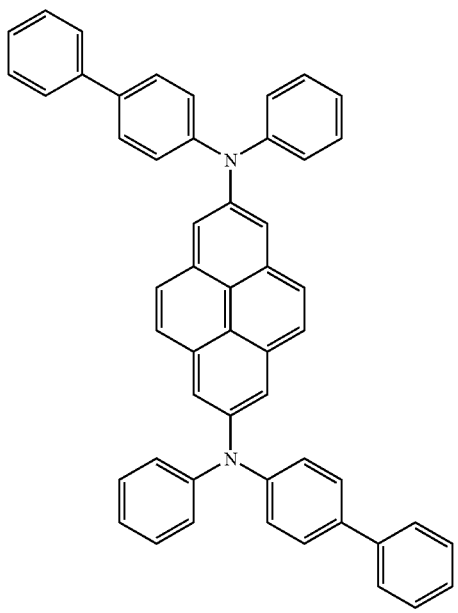
S-53
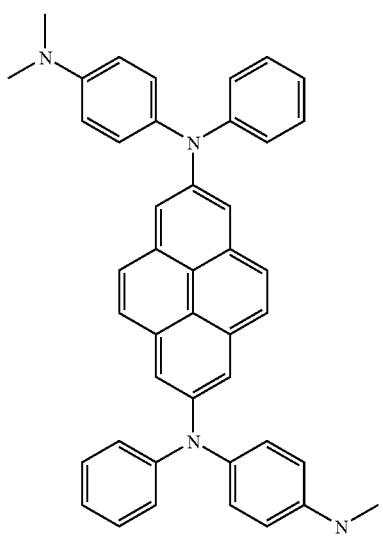
S-54
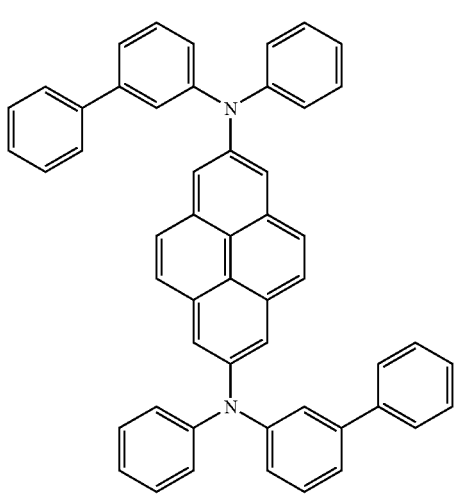
S-55
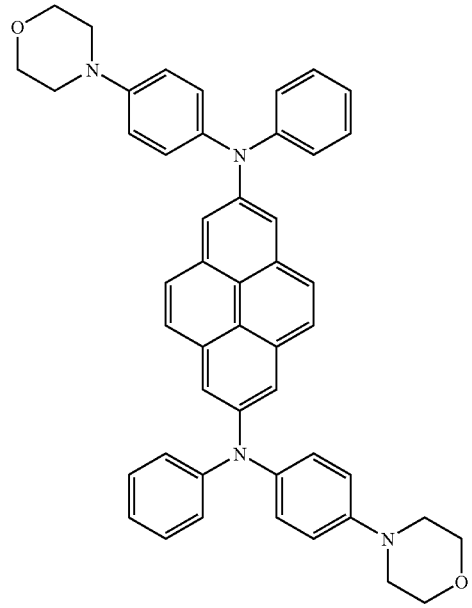
S-56
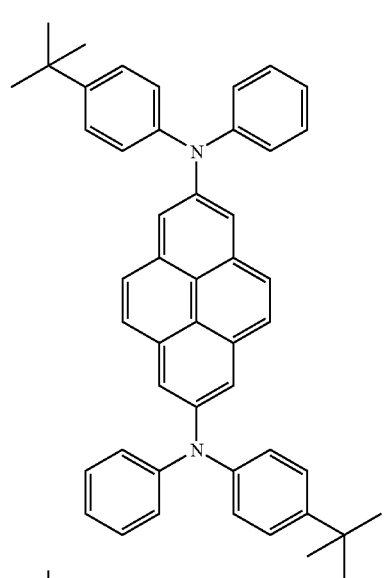
S-57
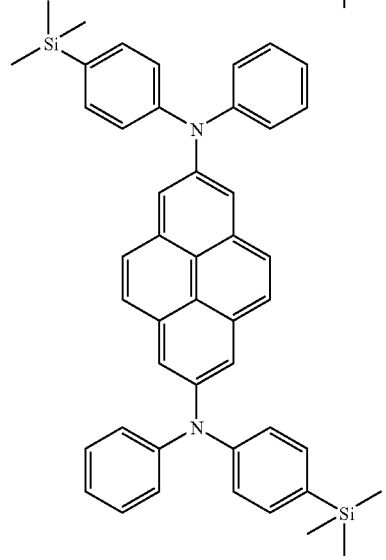

S-58
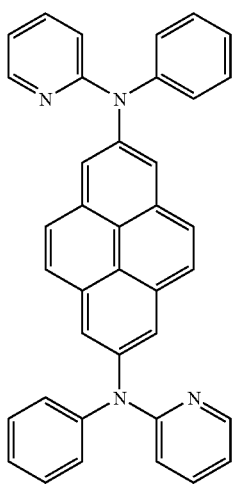
S-1
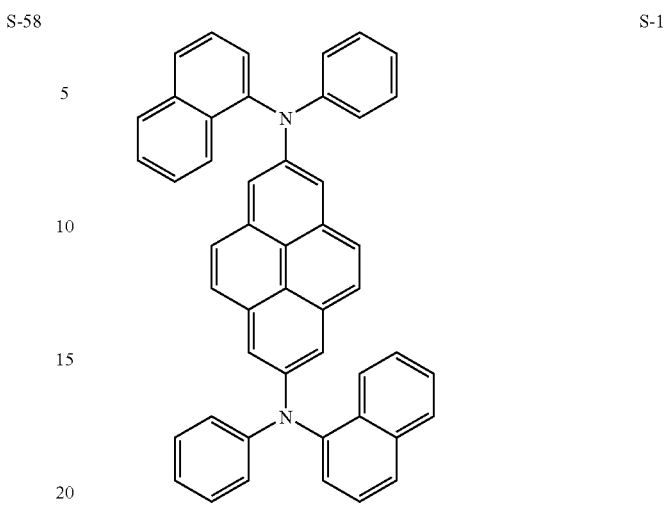
S-59
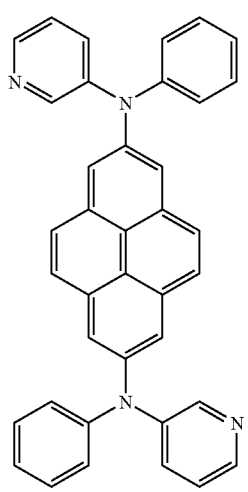
S-61
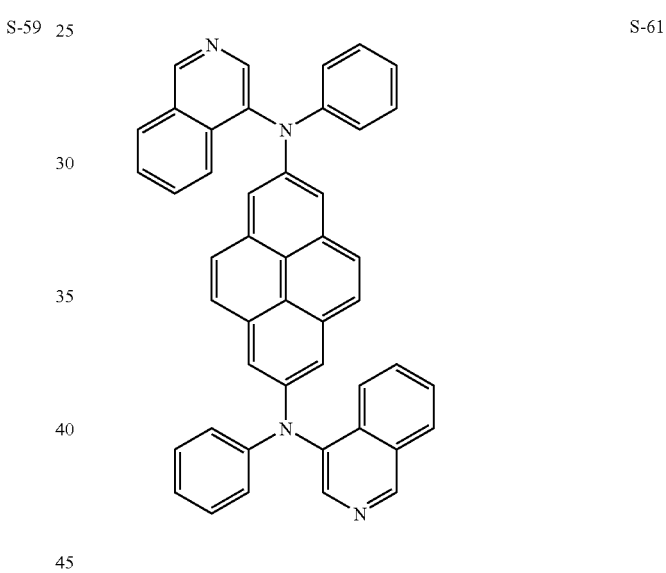
S-60
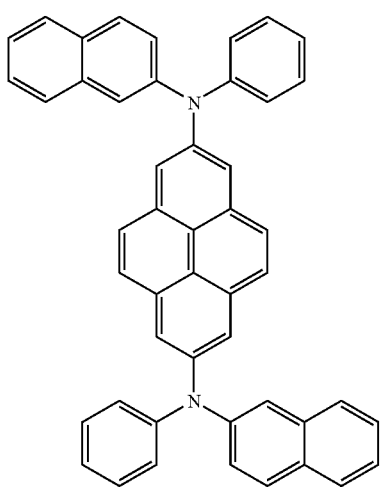
S-62
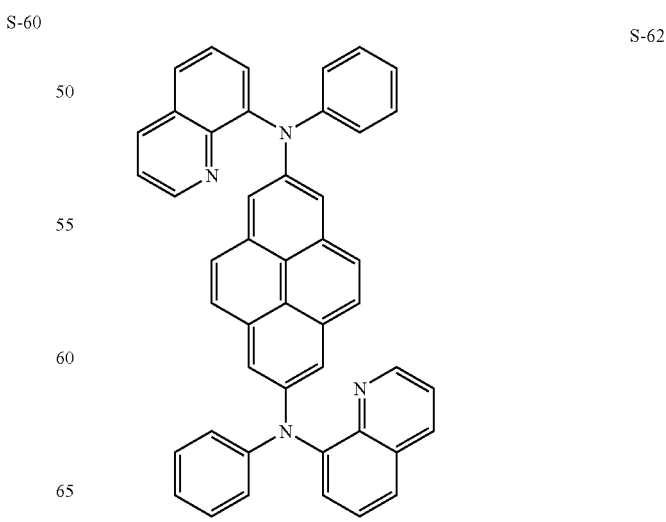

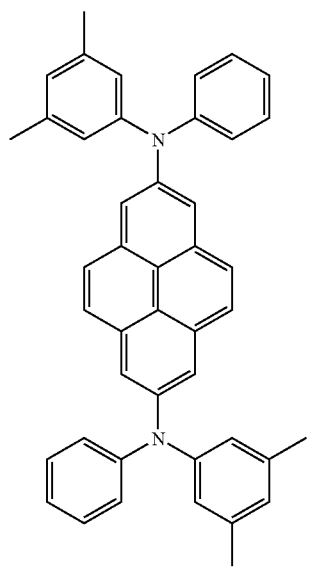
S-63
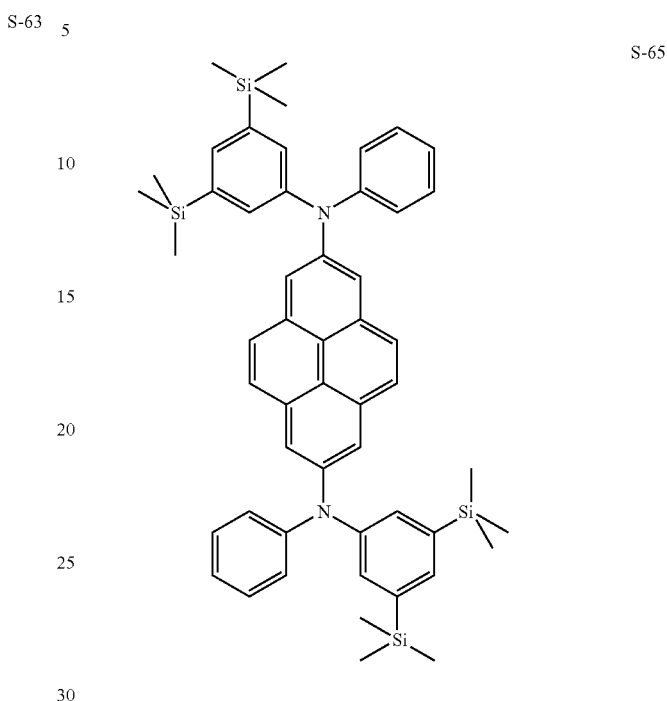
S-64
S-65
S-66
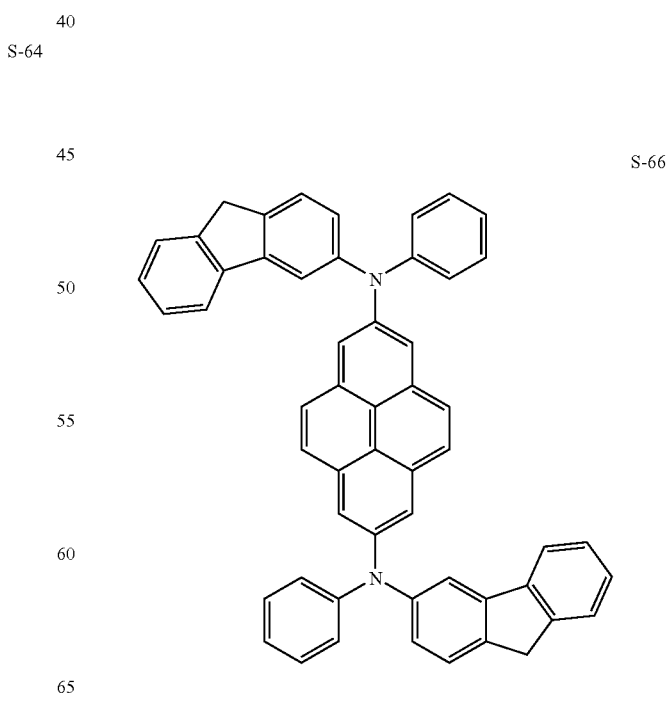

S-67
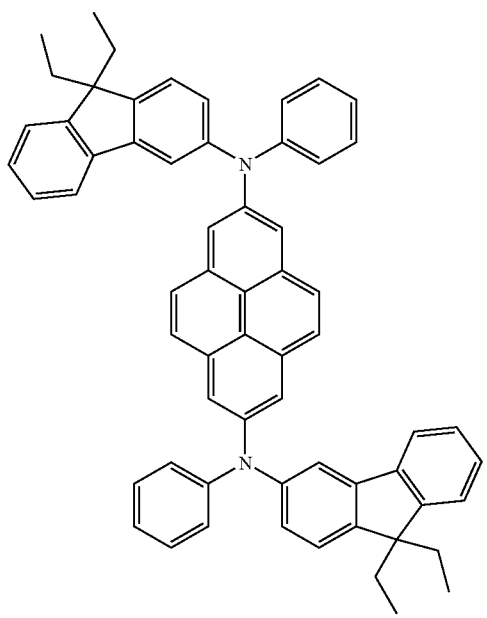
S-68
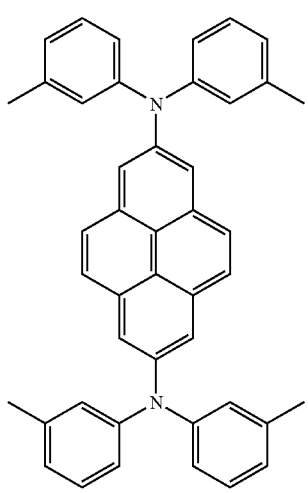
S-69
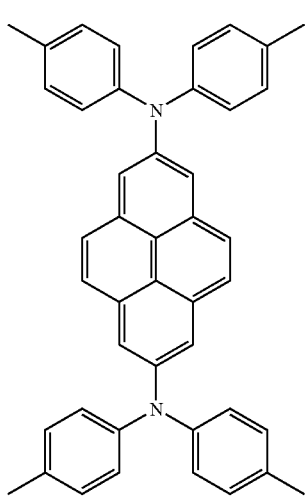
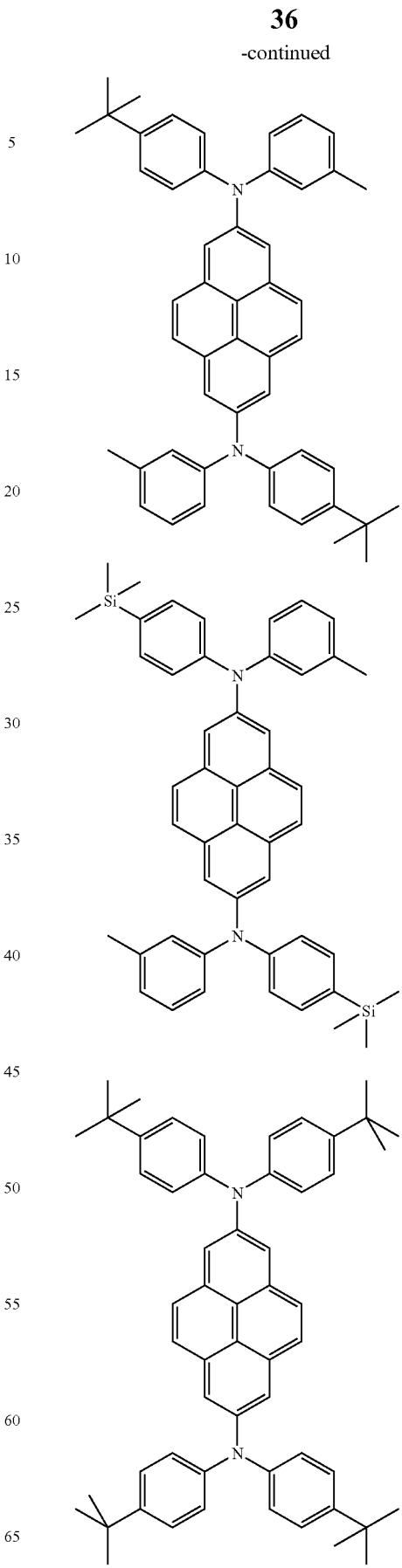

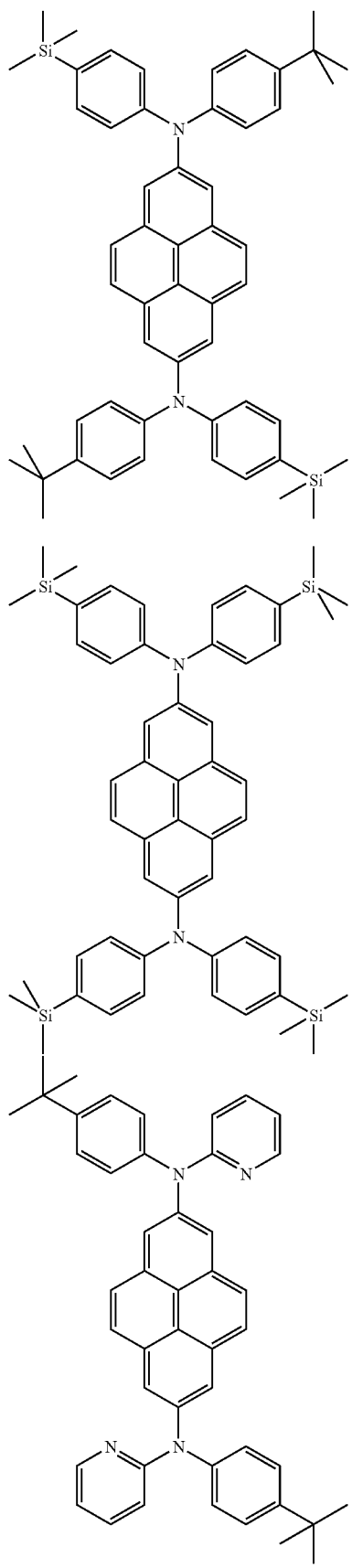
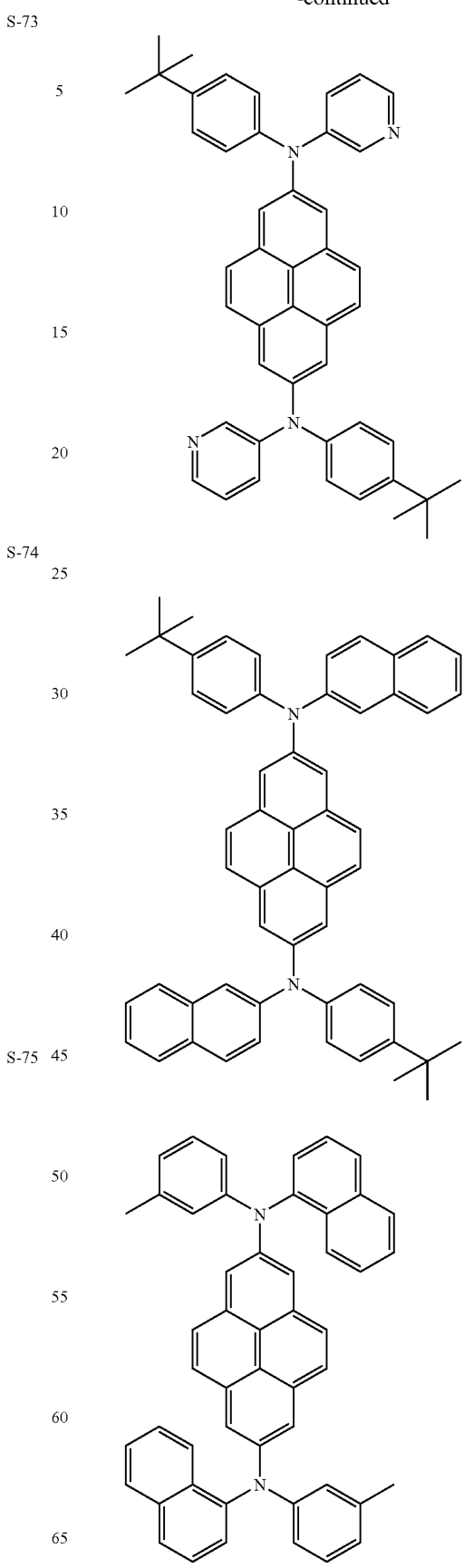

-continued
S79
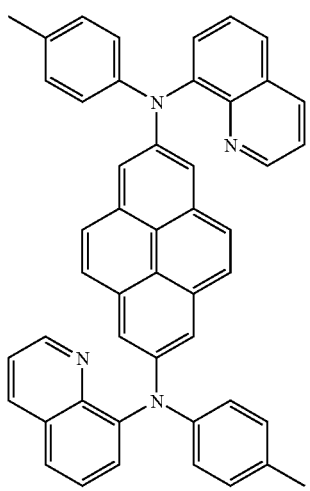
S-80
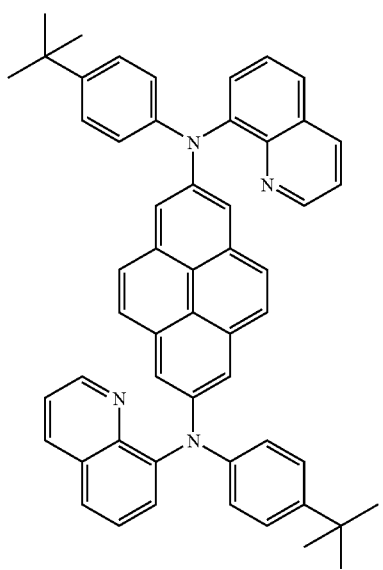
S-81
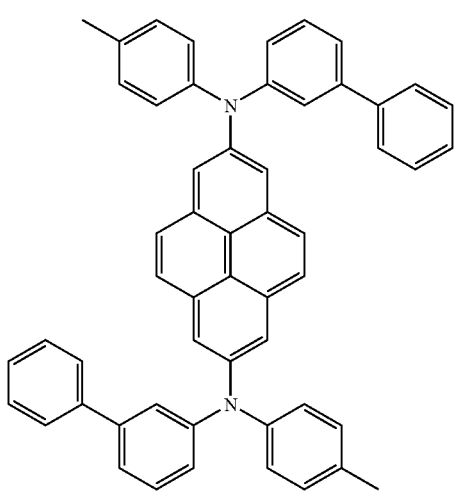
-continued
S-82
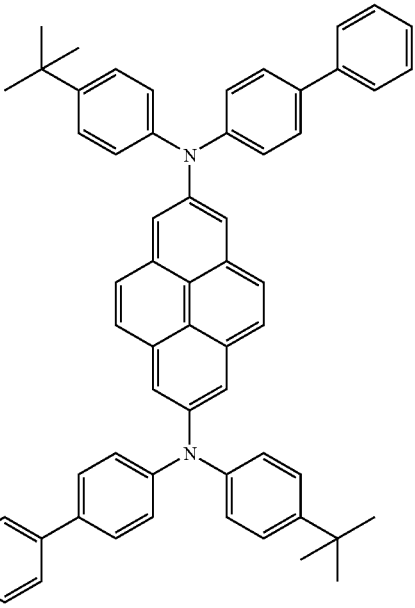
S-83
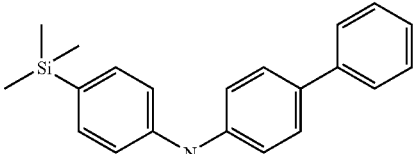

-continued
S-84
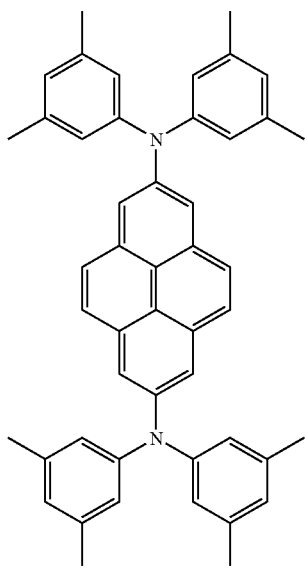
S-85
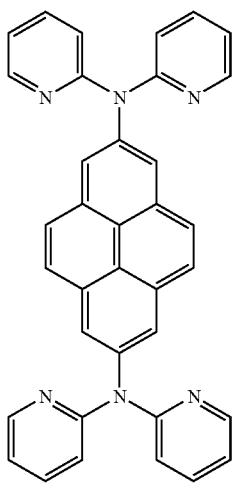
S-86
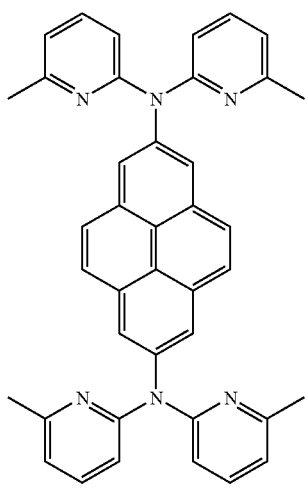
-continued
S-87
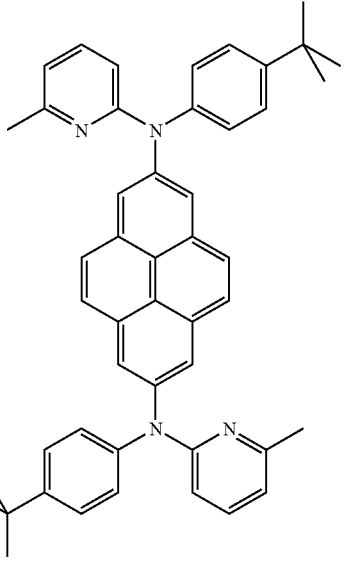
S-88
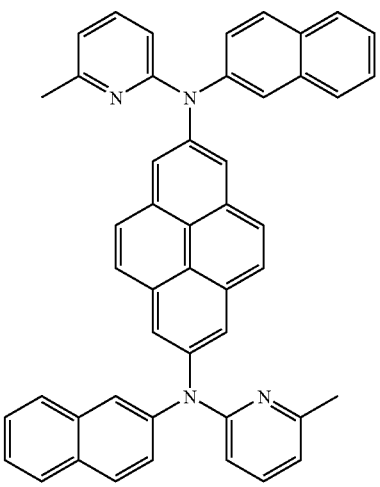
S-89
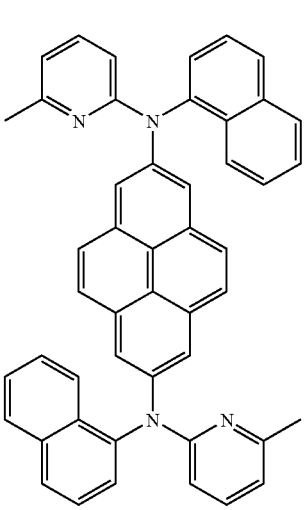

According to the organic electroluminescent device, N,N'-Bis-(4-tert-butyl-phenyl)-N,N'-di-pyridin-2-yl-pyrene-1,6-diamine employed as the blue emitting material is compounded as follows.

(1) Synthesis of 1,6-Dibromopyrene

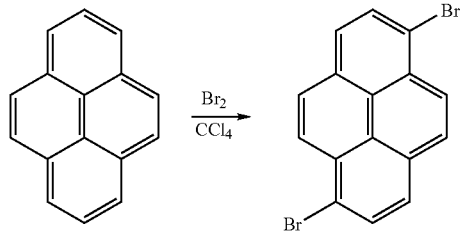

First, pyrene (10 g, 0.0049 mol) is dissolved into CCl$_4$ (300 mL) in a 3-necks-r.b.f. And, Br$_2$(17.38 g, 0.108 mol) 와 CCl$_4$ (50 mL) are put into a dropping funnel provided at the round-floor flask and slowly dropped in the round-floor flask for 4 hours. N$_2$ is added to and HBr is removed from the solution. When the process is finished, the solution is stirred under N$_2$ current for one hour and formed sediment is filtered.

When the sediment is recrystallized by toluene, a green solid matter (6.05 g, 34%) of 1,6-Dibromopyrene and a white solid matter of 1,8-Dibromopyrene (5 g, 28%) are obtained.

(2) Synthesis of N,N,N',N'-Tetraphenyl-pyrene-1,6-diamine

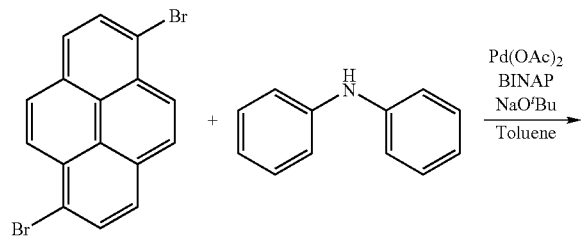

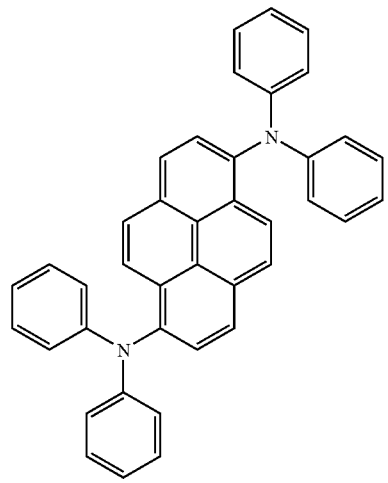

First, 1,6-Dibromopyrene (3 g, 0.0083 mol), Diphenylamine (4.23 g, 0.025 mol), BINAP([2,2'-Bis(diphenylphosphino)-1,1'-binaphthyl])(0.052 g, 1% mol), Pd(OAC)$_2$[Palladium(∥)acetate](0.019 g, 1% mol) and NaO$^t$Bu[Sodium tert-butoxide](2.3 g, 0.029 mol) are dissolved into toluene (80 mL) in 2-necks-r.b.f. so as to be refluxed.

When the reaction is finished, the 2-necks-r.b.f. is cooled at a normal temperature and about 40 ml of toluene, that is, a reaction solvent is removed by distillation under reduced pressure.

When methanol (100 ml) is added to the solution from which toluene 40 ml is removed, sediment is generated.

When the sediment is filtered, a yellow solid matter of N,N,N',N'-Tetraphenyl-pyrene-1,6-diamine (3.22 g, 72%) is obtained.

(3) Synthesis of (4-Bromo-phenyl)-trimethyl-silane

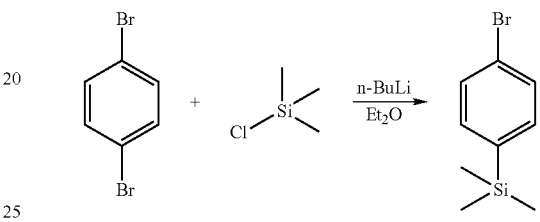

First, a dropping funnel is provided at the 3-necks-r.b.f. and the round-floor flask is dried under decompression. 1,4-Dibromobenzene (12.7 g, 0.053 mol) and the dried diethylether (300 mL) are dissolved in the round-floor flask.

A dryice bath is provided at the round-floor flask, n-BuLi (33.58 mL, 0.0537 mol) is put into the dropping funnel and n-BuLi is slowly dropped, and a temperature is slowly raised from −78° C. to 0° C.

Next, chloro trimethylsilane (7.51 mL, 0.059 mol) is slowly dropped at 0° C. and then the temperature is raised again to the normal temperature for over a period of one hour.

When the reaction is finished, sediment is extracted by using diethylether and water is removed from the result by using MgSO$_4$.

And then, after solvent is removed from the result, when the solvent is fractionally distilled under decompression, (4-Bromo-phenyl)-trimethyl-silane (11.3 g, 92%) is obtained.

(4) Synthesis of (4-tert-Butyl-phenyl)-(4-trimethylsilanyl-phenyl)-amine

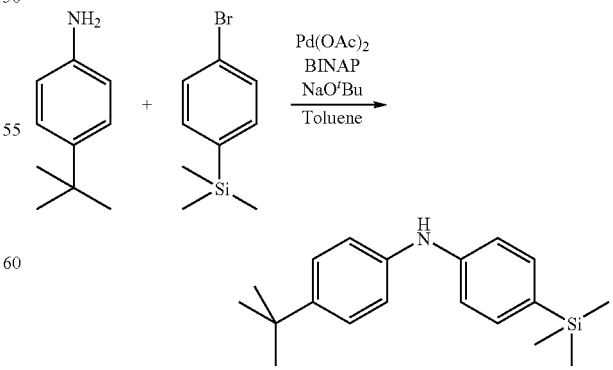

4-tert-Butyl-phenylamine (1.2 mL, 0.0076 mol), (4-Bromo-phenyl)-trimethyl-silane (1 g, 0.0044 mol), BINAP (0.03 g, 1% mol), Pd(OAc)₂(0.01 g, 1% mol) and NaO'Bu (1.5 g, 0.016 mol) are dissolved into toluene (50 mL) in the 2-necks-r.b.f. so as to be refluxed for about 2 hours.

When the reaction is finished, the 2-necks-r.b.f. is cooled and toluene, which is reaction solvent, is removed.

Next, when the sediment is filtered, the white solid matter such as (4-tert-Butyl-phenyl)-(4-trimethylsilanyl-phenyl)-amine (1.12 g, 86%) is obtained.

(5) Synthesis of N,N'-Bis-(4-tert-butyl-phenyl)-N,N'-bis-(4-trimethylsilanyl-phenyl)-pyrene-1,6-diamine

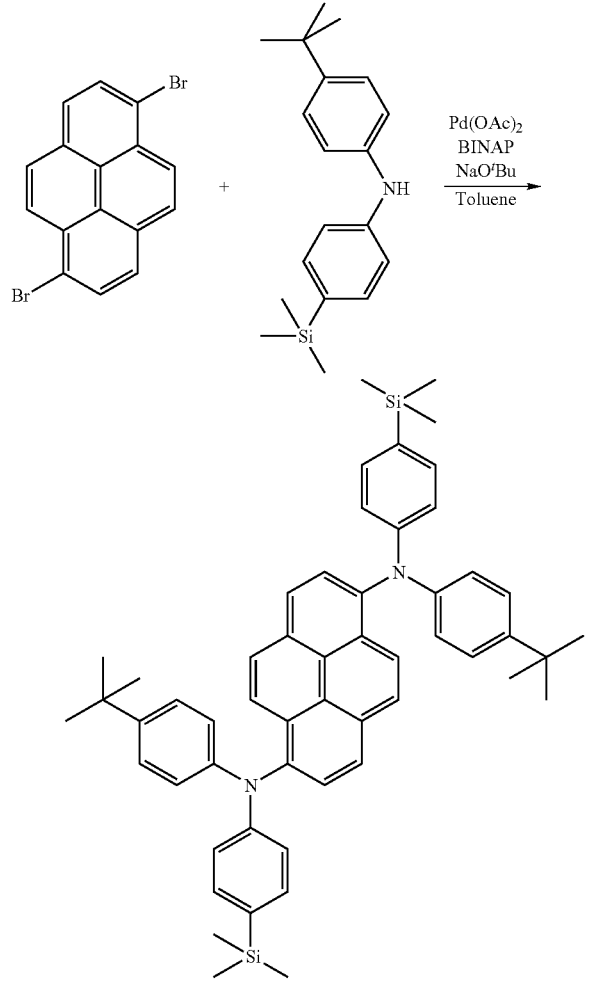

(1,6-Dibromopyrene)(0.787 g, 0.0022 mol), (4-tert-Butyl-phenyl)-(4-trimethylsilanyl-phenyl)-amine)(1.56 g, 0.00525 mol), BINAP (0.054 g, 4% mol), Pd(OAc)₂(0.015 g, 3% mol) and NaO'Bu (0.93 g, 0.0096 mol) are dissolved in toluene (40 mL) so as to be refluxed for 24 hours.

When reaction is finished, the round-floor flask is cooled and result material is extracted by using water and methylene chloride after toluene, that is, the reaction solvent is removed.

And then, water is removed from the result by using MgSO₄ and methylene chloride is removed by decompression, and silica gel chromatography is separated by using n-hexane:methylene chloride (6:1).

When the solvent is removed from the result and a solid matter is filtered by using nucleic acid, yellow solid matter such as (N,N'-Bis-(4-tert-butyl-phenyl)-N,N'-bis-(4-trimethylsilanyl-phenyl)-pyrene-1,6-diamine)(1.09 g, 63%) is obtained.

(6) Synthesis of N,N'-Diphenyl-N,N'-di-pyridin-2-yl-pyrene-1,6-diamine

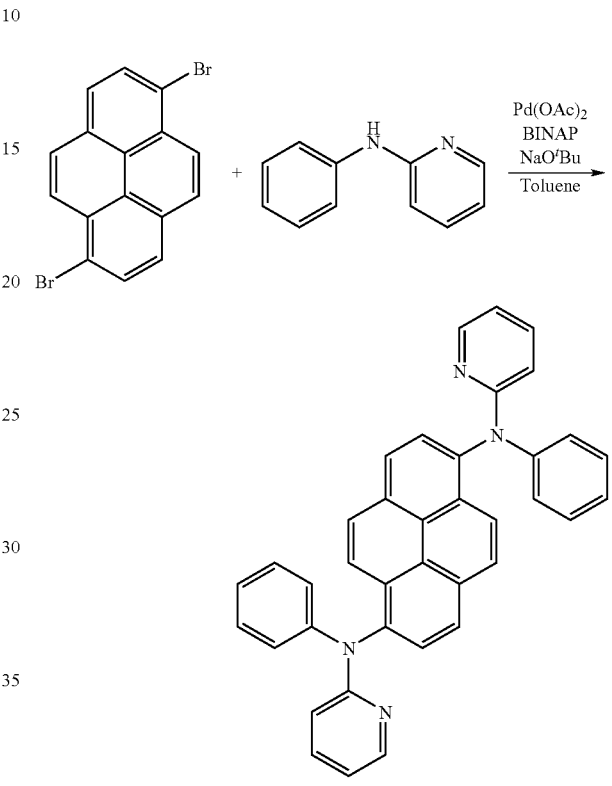

(1,6-Dibromopyrene) (1.2 g, 0.0033 mol), (Phenyl-pyridin-2-yl-amine)(1.36 g, 0.008 mol), BINAP (0.083 g, 4% mol), Pd(OAc)₂(0.022 g, 3% mol) and NaO'Bu (1.28 g, 0.013 mol) are dissolved in toluene (50 mL) in the 2-necks-r.b.f. so as to be refluxed for 24 hours.

When the reaction is finished, solid matter is generated.

When 50% of toluene is removed from the solid matter, and methanol (70 ml) is added to the solid matter, which then is filtered, yellow solid matter (N,N-Diphenyl-N,N-di-pyridin-2-yl-pyrene-1,6-diamine)(0.81 g, 45%) is obtained.

(7) Synthesis of (4-terr-Butyl-phenyl)-pyridin-2-yl-amine

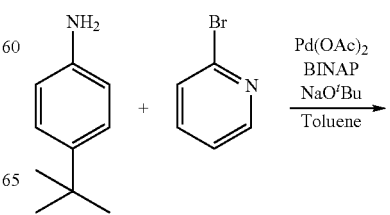

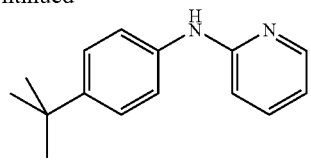

(4-tert-Butyl-phenylamine) (1.2 mL, 0.0076 mol), (2-Bromo pyridine)(1 mL, 0.01 mol), BINAP (0.06 g, 4% mol), Pd(OAc)$_2$(0.02 g, 3% mol) and NaO$^t$Bu (1.5 g, 0.016 mol) are dissolved in toluene (50 mL) in the 2-necks-r.b.f. so as to be refluxed for 24 hours.

When the reaction is finished, the 2-necks-r.b.f. is cooled and toluene, that is, reaction solvent is removed. Result material is extracted by using water and methylene chloride, methylene chloride is removed under decompression after water is removed by using MgSO$_4$.

Silica gel short column is generated by methylene chloride, sediment is formed by using nucleic acid. When the sediment is filtered, white solid matter such as 4-tert-Butyl-phenyl)-pyridin-2-yl-amine (1.32 g, 73%) is obtained.

(8) Synthesis of N,N'-Bis-(4-tert-butyl-phenyl)-N,N'-di-pyridin-2yl-pyrene-1,6-diamine

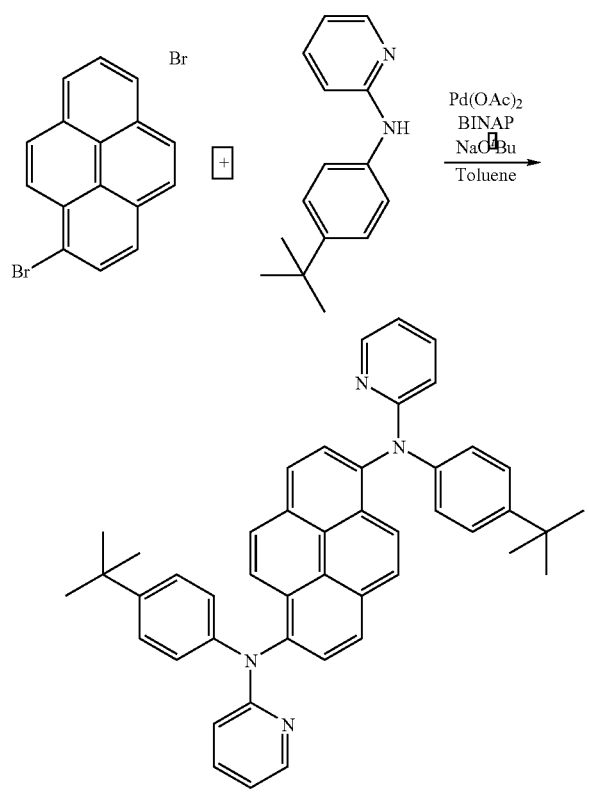

1,6-Dibromopyrene (1 g, 0.0028 mol), (4-tert-Butyl-phenyl)-pyridin-2-yl amine (1.51 g, 0.0067 mol), BINAP (0.07 g, 4% mol), Pd(OAc)$_2$(0.02 g, 3% mol) NaO$^t$Bu (1.18 g, 0.012 mol) are dissolved in toluene (45 mL) in the 2-necks-r.b.f. so as to be refluxed for 24 hours.

When the reaction is finished, solid matter is generated. 50% of toluene is removed from the solid matter, which is then filtered after methanol (70 mL) is added thereto. When the solvent is removed by silica gel short column by using methylene chloride, (N,N'-Bis-(4-tert-butyl-Phenyl)-N,N'-di-pyridin-2-yl-pyrene-1,6-diamine)(0.99 g, 60%) is obtained.

Hereinafter, a preferred embodiment of the organic electroluminescent device will be described according to the present invention.

EMBODIMENT

An ITO glass is patterned so as to have a size of 3 mm×3 mm. The patterned ITO glass is then cleaned.

A substrate is loaded on a vacuum chamber of which basic pressure is set up as 1×10$^{-6}$ torr, CuPC(200 Å), NPB(500 Å), a light-emitting layer (300 Å), Alq$_3$(500 Å), LiF(5 Å), and Al(1,000 Å) are deposited on the ITO in order.

In this case, material in a following drawing is employed as a first HOST of the emitting layer and a mixing ratio of the host and dopant is 1:0.01.

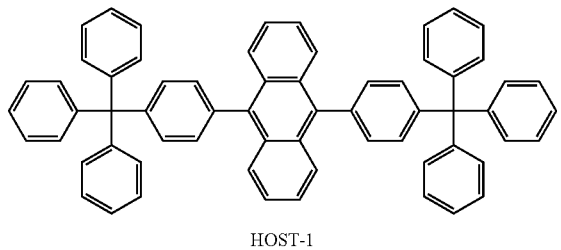

HOST-1

First Embodiment

When about 1 mA of electric current is flown by using dopant having a chemical formula of S-26, brightness shows about 3.2 cd/A, whereby CIE (Commision Internationale de L'Eclairage) x=0.146, y=0.205.

Second Embodiment

When about 1 mA of electric current is flown by using dopant having a chemical formula of S-28, brightness shows about 3.4 cd/A, whereby CIE (Commision Internationale de L'Eclairage) x=0.15, y=0.196.

Comparative Embodiment

ITO (Indium Tin Oxide) glass is patterned so as to have a size of 3 mm×3 mm. The patterned ITO glass is then cleaned.

A substrate is loaded on a vacuum chamber of which basic pressure is set up as 1×10$^{-6}$ torr, and such an organic matters as CuPC(200 Å), NPB(500 Å), emitting layer (300 Å), Alq$_3$ (200 Å), LiF(5 Å), and Al(1000 Å) are deposited on the ITO glass.

When about 1 mA of electric current is flown, brightness is about 1.8 cd/A, whereby CIE (Commision Internationale de L'Eclairage) x=0.15, y=0.196.

Accordingly, the present invention is a blue emitting material of an emitting layer and an organic elecroluminescent device with blue color purity and a high luminescent efficiency is obtained by material with high color purity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent material, comprising;

a blue emitting material comprising;

a) a dopant represented by a formula 1

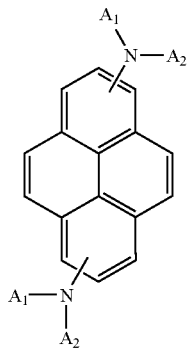

wherein each of $A_1$ and $A_2$ is one of the following formulas

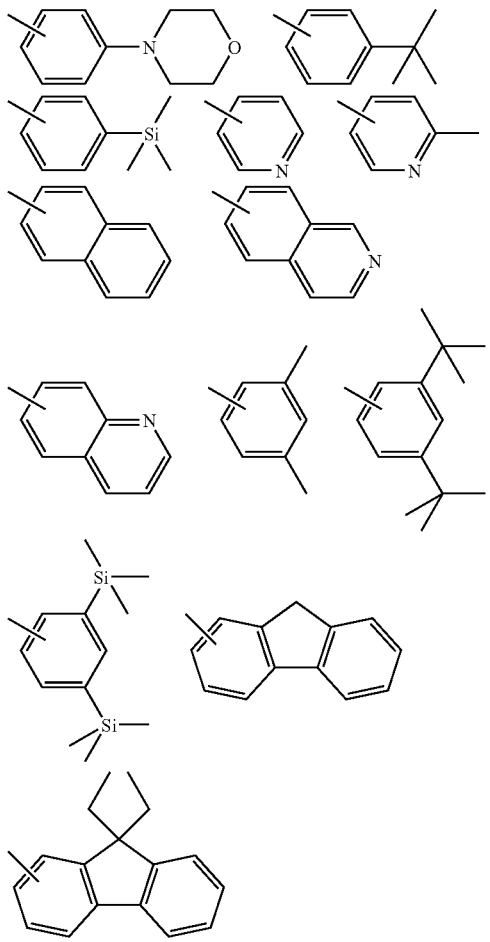

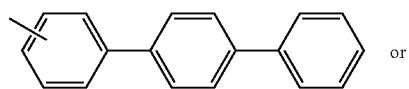

wherein $A_1$ is one formula of the following two groups X and Y, $A_2$ is one formula of the following two groups X and Y, and $A_1$ and $A_2$ are the same or different from each other

[X group]

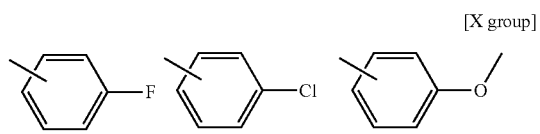

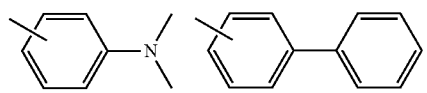

[Y group]

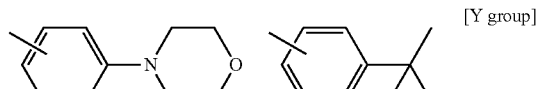

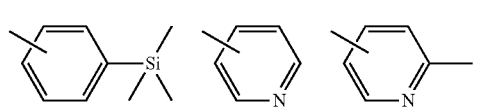

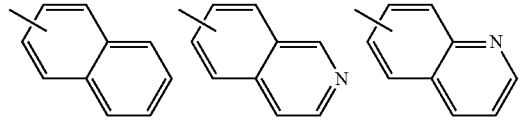

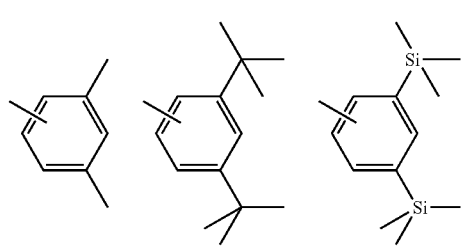

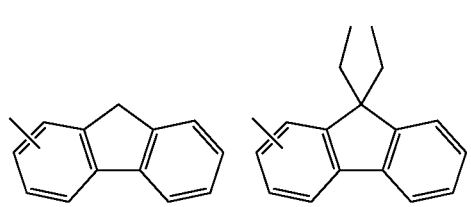

and
b) a host represented by one of the following formulas
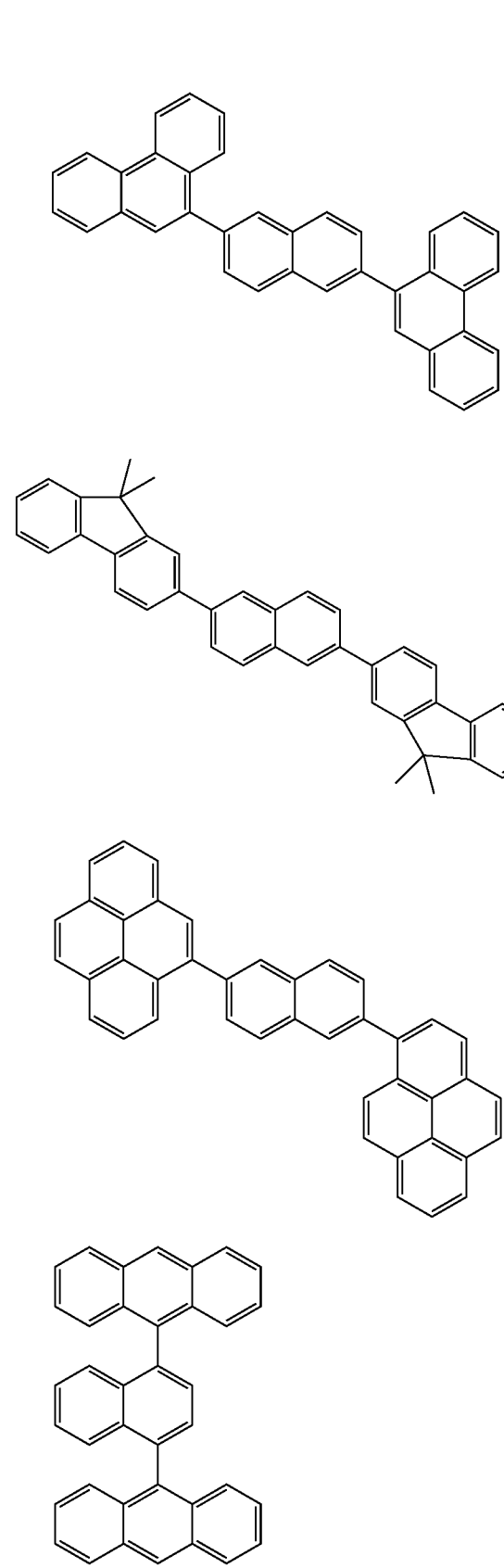
H-1
H-2
H-3
H-4
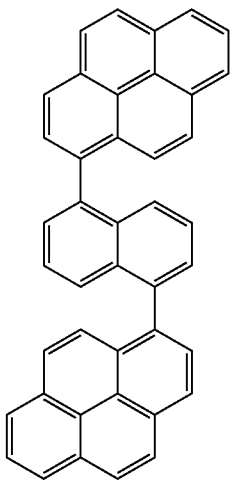
H-5
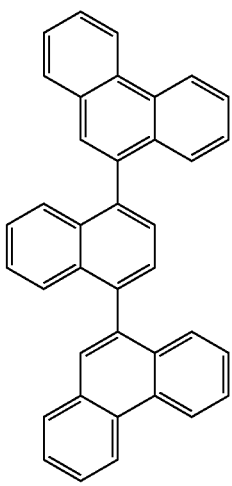
H-6
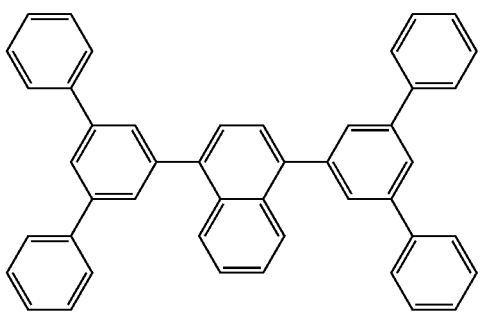
H-7
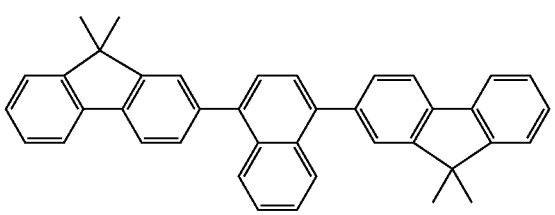
H-8

H-9
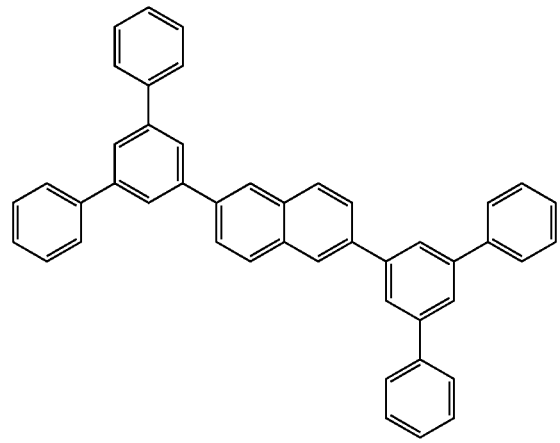
H-10
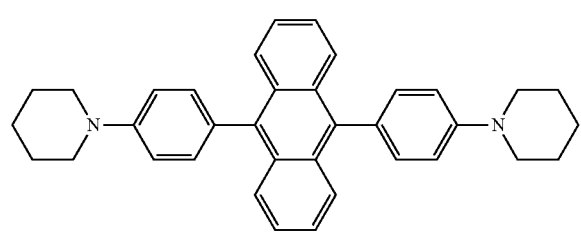
H-12
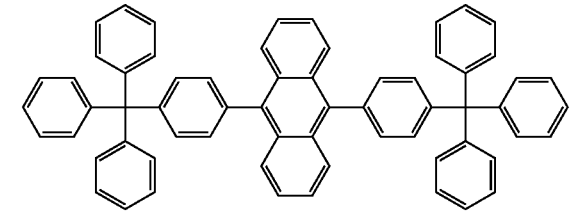
H-13
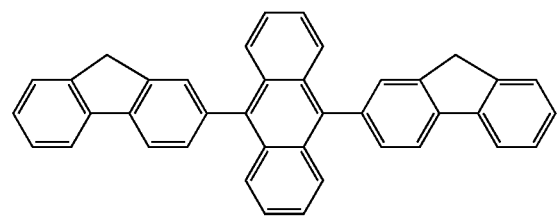
H-15
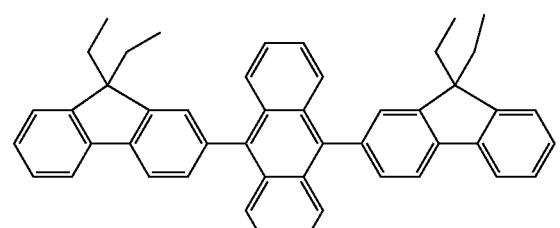
H-16
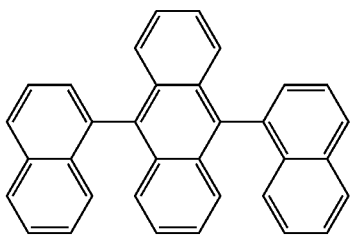
H-17
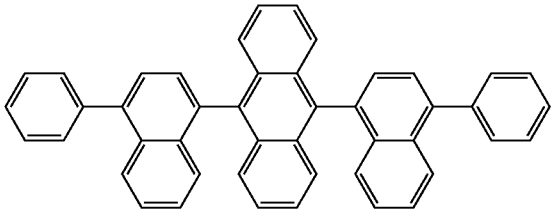
H-19
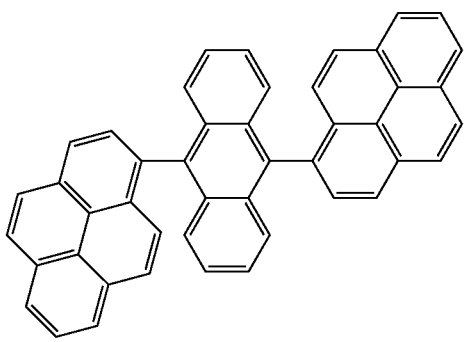
H-20
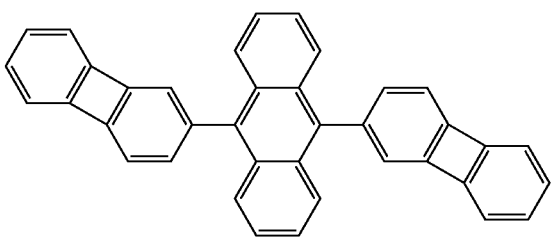
H-21
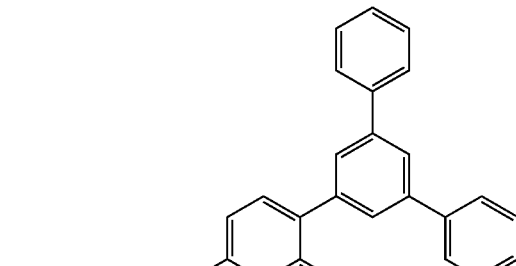
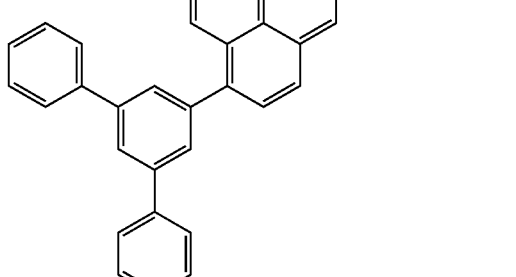

2. The organic electroluminescent material of claim 1, comprising;
the dopant represented by one of the following formulas
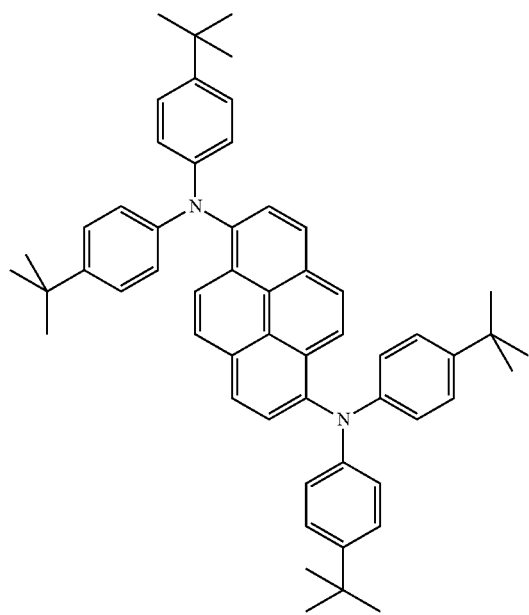
S-27
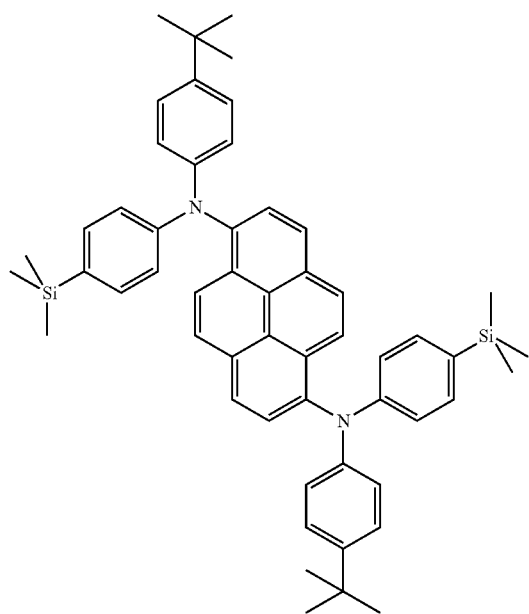
S-28
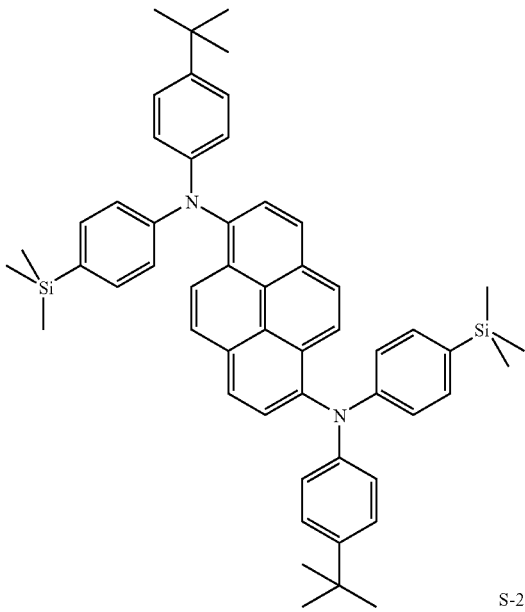
S-28
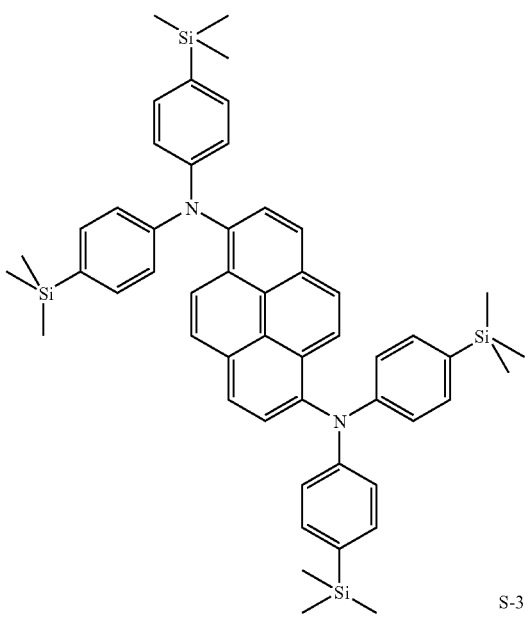
S-29
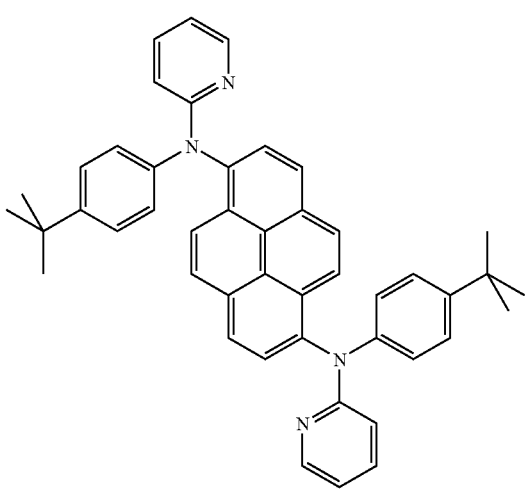
S-30

S-31
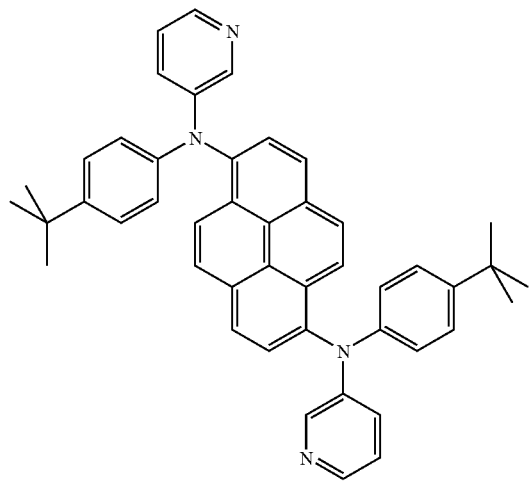
S-32
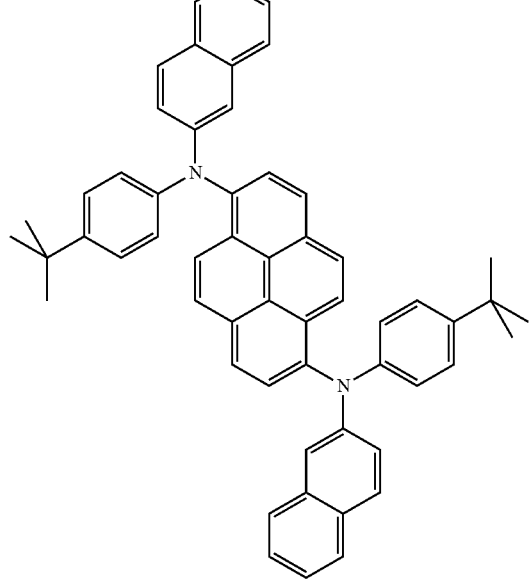
S-35
S-37
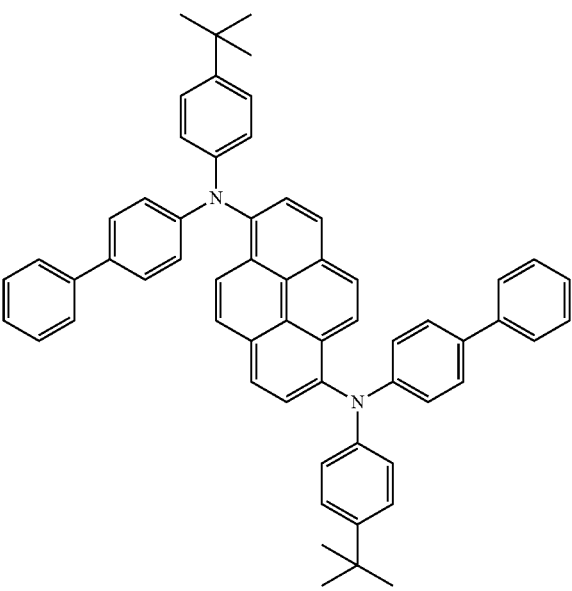
S-37
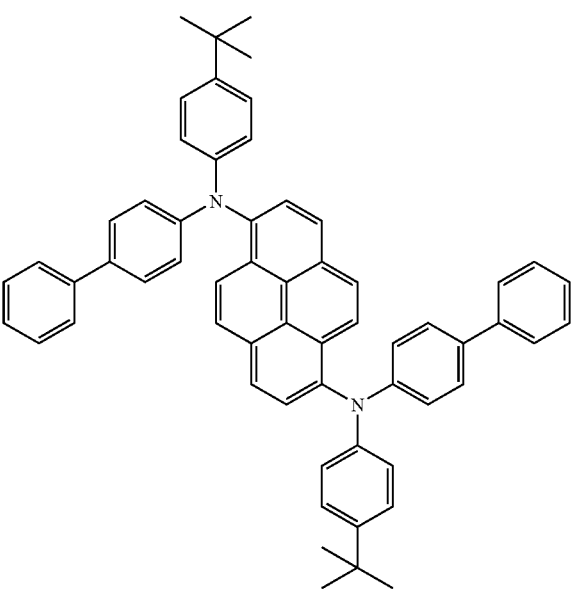

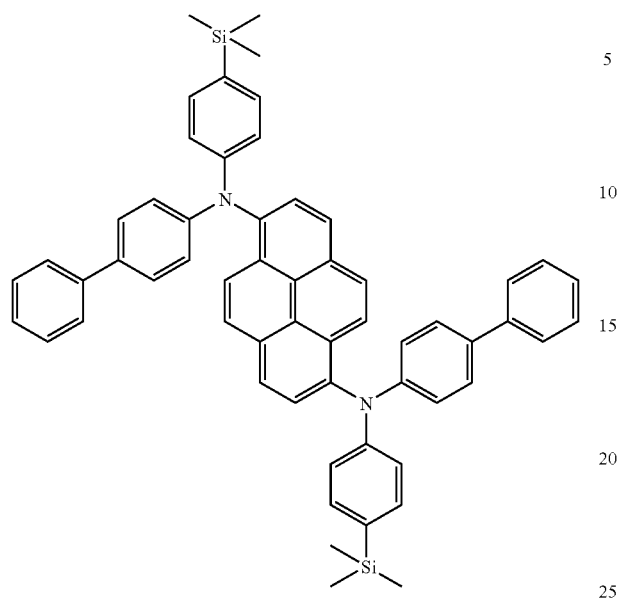
S-38
S-40
S-41
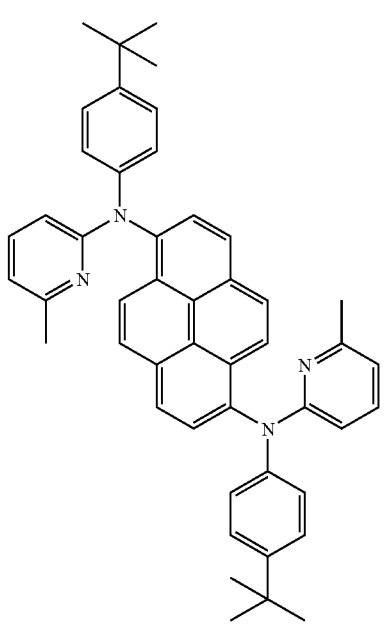
S-42
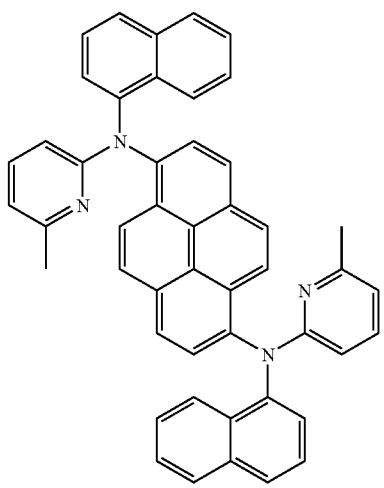
S-43
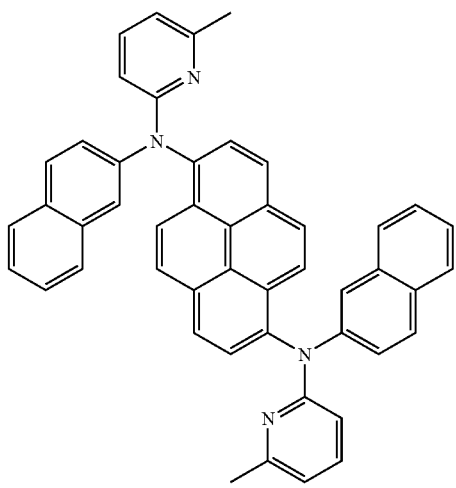
S-44

S-72 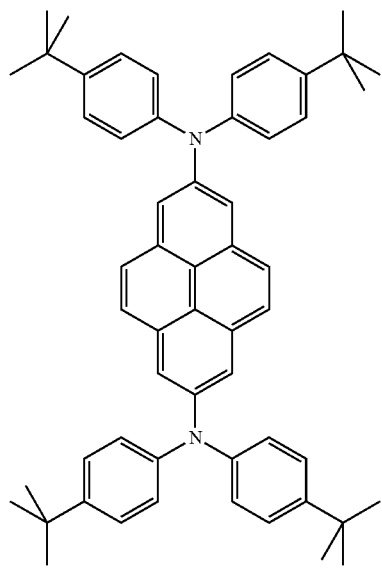
S-73 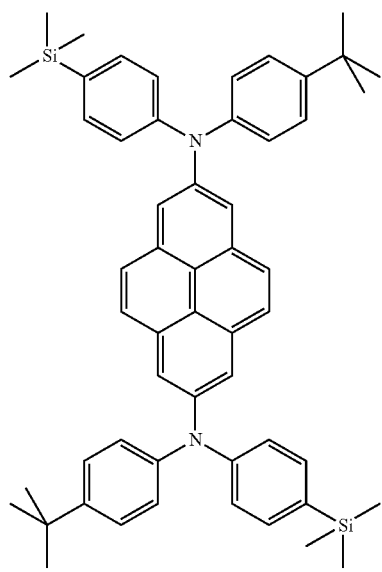
S-74 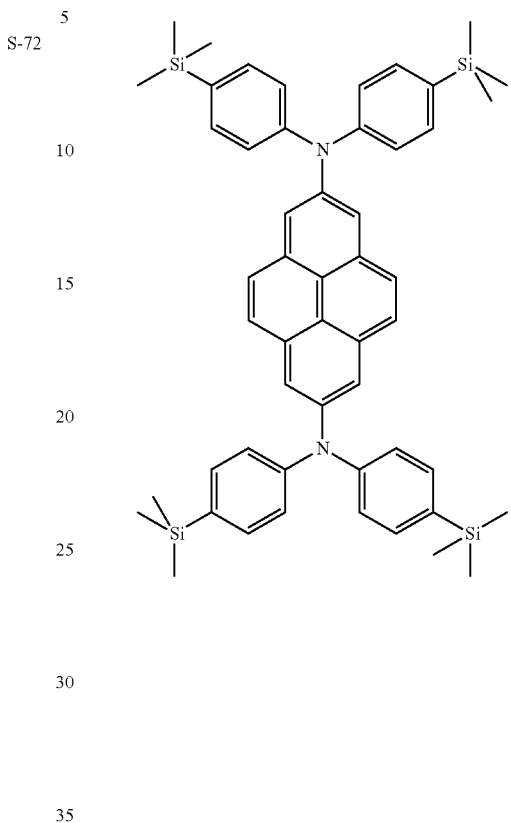
S-75 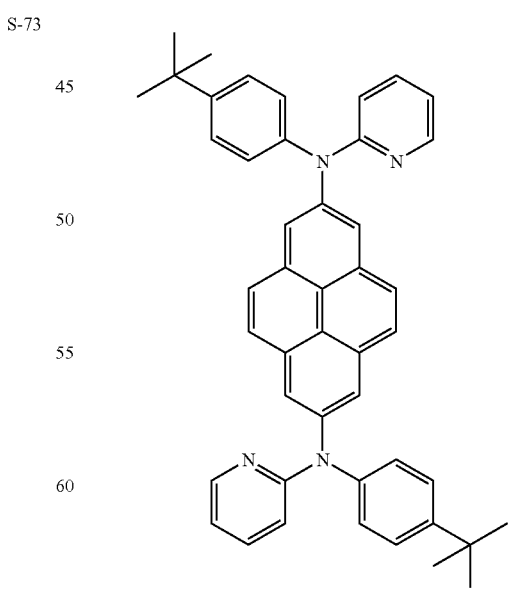

S-76
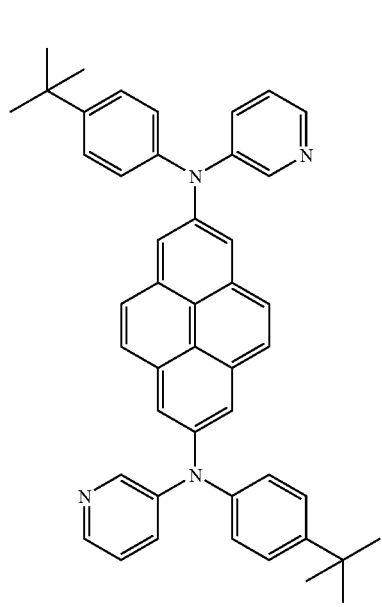
S-80
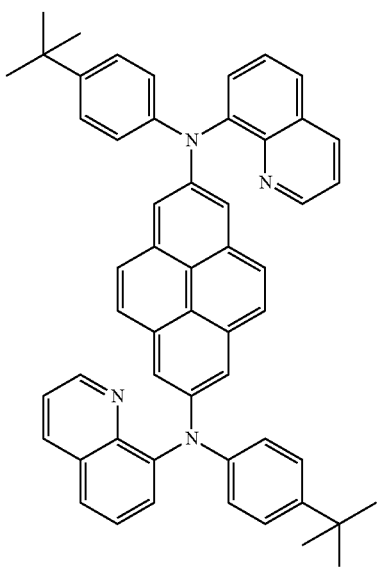
S-77
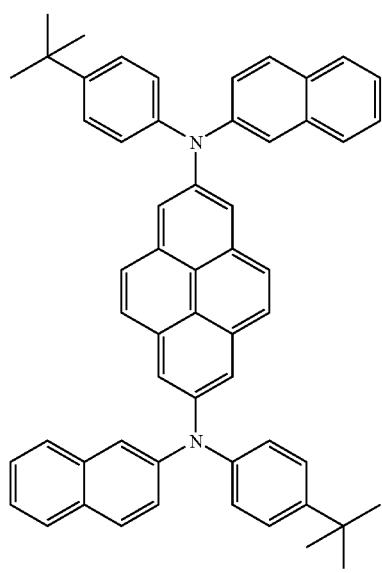
S-82
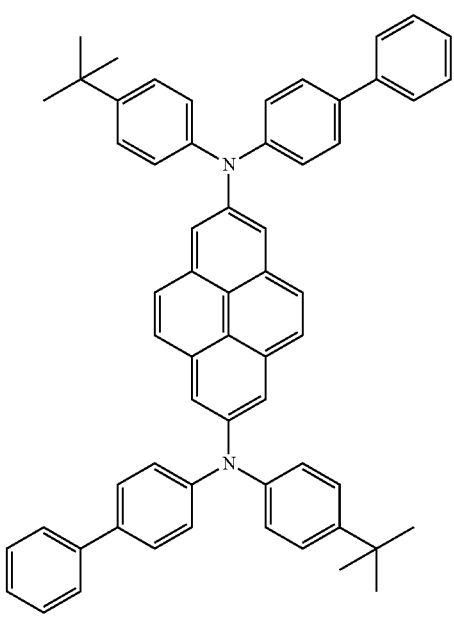

S-83
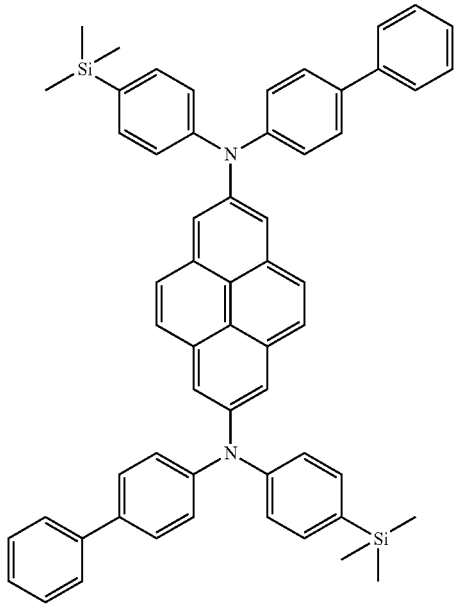
S-85
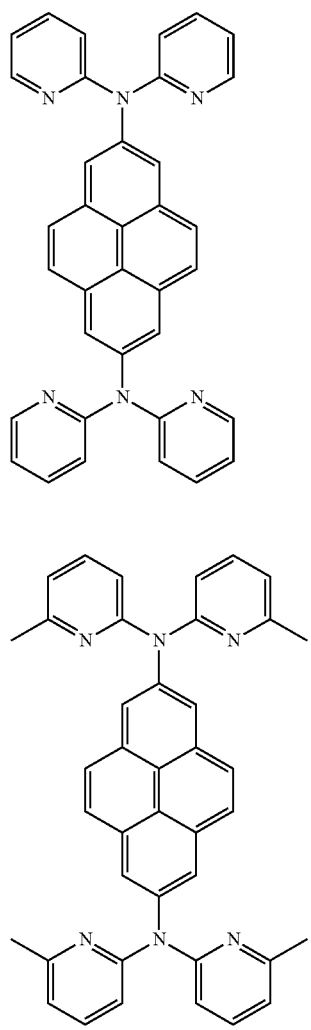
S-86
S-87
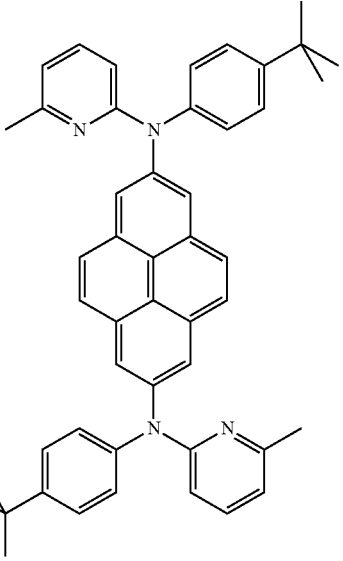
S-88
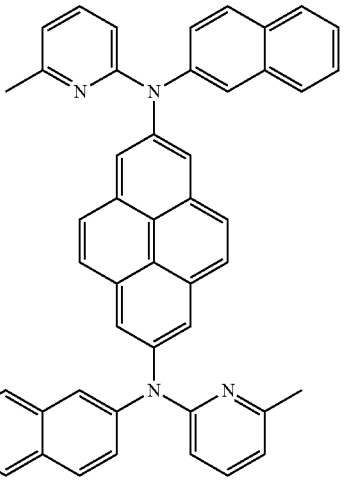
S-89
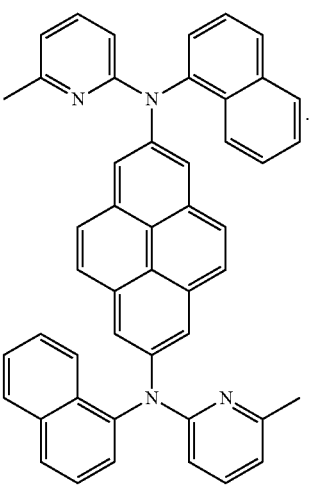
3. A blue organic electroluminescent device, comprising:
a first electrode and a second electrode;
an organic emitting layer comprising;

a) a dopant represented by a following formula 1

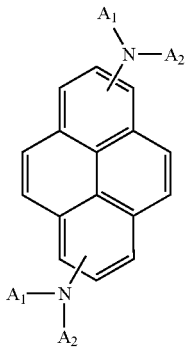

wherein $A_1$ and $A_2$ are selected from a substituted or non-substituted biphenyl, a substituted or non-substituted pyridyl, a substituted or non-substituted naphthyl, a substituted or non-substituted quinolyl, a substituted or non-substituted isoquinolyl, a substituted or non-substituted fluorenyl, a substituted or non-substituted terphenyl, methyl, ethyl, propyl, propyl, and t-butyl;

wherein a substituent of each substituted $A_1$ and $A_2$ is one selected from methyl, ethyl, propyl, i-propyl, t-butyl, cyclohexyl, methoxy, ethoxy, propoxy, butoxy, dimethylamino, trimethylsilyl, fluorine, chlorine, phenoxy, tolyoxy, dimethylamino, diethylamino, dithylamino, diphenylamino, and triphenylsilyl b) a host represented by a following formula 2

B1-X—B2 wherein the X is selected from a group consisting of naphthalene, phenanthrene, pyrene, perylene, and quinoline, wherein the B1 and B2 are selected from phenyl, pyridyl, naphthyl, tritolylphenyl, biphenylenyl, anthryl, phenanthryl, pyrenyl, perylenyl, quinolyl, isoquinolyl, fluorenyl, terphenyl, tolyl, xylyl, methylnaphthyl, and hydrogen.

4. The blue organic electroluminescent device of claim 3, wherein wt. % of the material of the chemical formula 1 is 0.1-49.9 wt. % of a total weight of the organic emitting layer, the organic emitting layer having a plurality of materials and being the blue emitting material using the chemical formula 1 as the dopant.

* * * * *